United States Patent

Hirano

[11] Patent Number: 6,067,251
[45] Date of Patent: May 23, 2000

[54] NON-VOLATILE SEMICONDUCTOR MEMORY DEVICE

[75] Inventor: Yasuaki Hirano, Yamatokoriyama, Japan

[73] Assignee: Sharp Kabushiki Kaisha, Osaka, Japan

[21] Appl. No.: 09/179,914

[22] Filed: Oct. 27, 1998

[30] Foreign Application Priority Data

Oct. 30, 1997 [JP] Japan .................................. 9-299167

[51] Int. Cl.[7] ...................................................... G11C 7/00
[52] U.S. Cl. ............................... 365/185.18; 365/185.01; 365/185.29; 365/185.28; 365/185.33
[58] Field of Search ......................... 365/185.29, 185.33, 365/185.01, 185.28

[56] References Cited

U.S. PATENT DOCUMENTS

| | | | |
|---|---|---|---|
| 5,414,658 | 5/1995 | Challa | 365/185 |
| 5,515,319 | 5/1996 | Smayling et al. | 365/185.27 |
| 5,789,776 | 8/1998 | Lancaster et al. | 257/296 |
| 5,808,336 | 9/1998 | Miyawaki | 257/315 |
| 5,907,171 | 5/1999 | Santin et al. | 257/315 |

FOREIGN PATENT DOCUMENTS 06077437  3/1994  Japan .

OTHER PUBLICATIONS

Johnson et al. "A 16Kb Erasable Nonvolatile Memory" *IEEE ISSCC Dig. Tech. Pap.* (1980) pp. 152–153.

Kato et al. "'AND' cell structure for a 3V-only 64Mbit Flash Memory" *SMD* (1993) pp. 37–43.

Onoda et al. "A Novel Cell Structure Suitable for a 3 volt Operation, Sector Erase Flash Memory" *SDM 93* (1993) pp. 15–20.

Yamauchi et al. "A New Cell Structure for Sub–quarter Micron High Density Flash Memory" *IEDM Tech. Dig.* (1995) pp. 267–270.

*Primary Examiner*—Viet Q. Nguyen
*Attorney, Agent, or Firm*—Morrison & Foerster LLP

[57] ABSTRACT

A non-volatile semiconductor memory device according to the present invention includes: a matrix of word lines and bit lines intersecting one another; and a memory cell of a stack gate type being disposed so as to correspond to each intersection of the matrix of the bit lines and the word lines, the memory cell including a control gate, a drain, and a source, the control gate being coupled to a corresponding one of the word line, the drain being coupled to a corresponding one of the bit lines, and the memory cell being capable of performing a write operation and an erase operation based on an FN tunnel phenomenon. Data is written to the memory cell by applying a reference voltage to the control gate, a first voltage to a well in which the memory cell is formed, and a second voltage to the drain; and data is erased from the memory cell by applying a third voltage to the control gate and the reference voltage to the well. Each of the first, second, and third voltages is equal to or greater than zero volts, and the second voltage is greater than the first voltage.

10 Claims, 17 Drawing Sheets

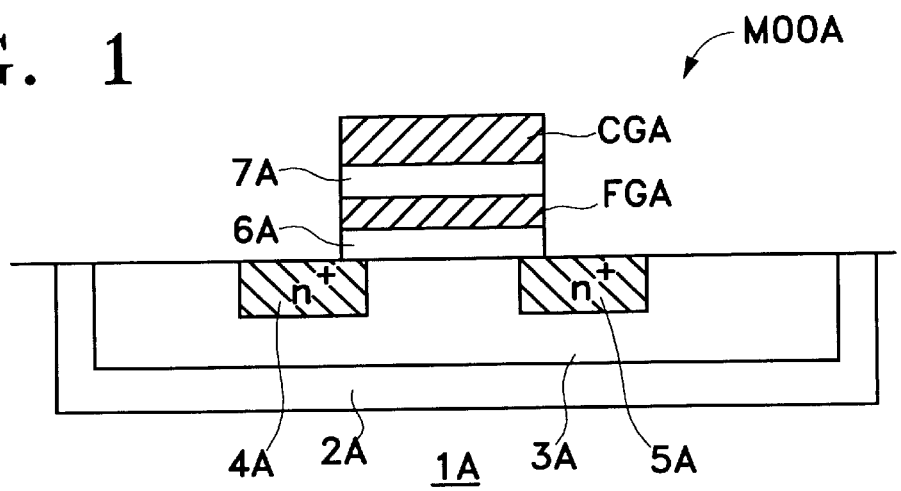
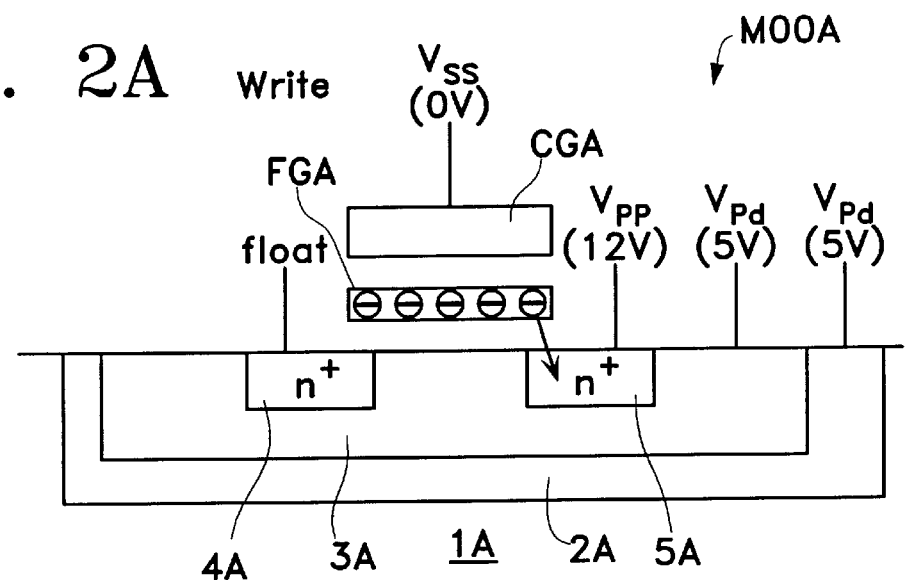
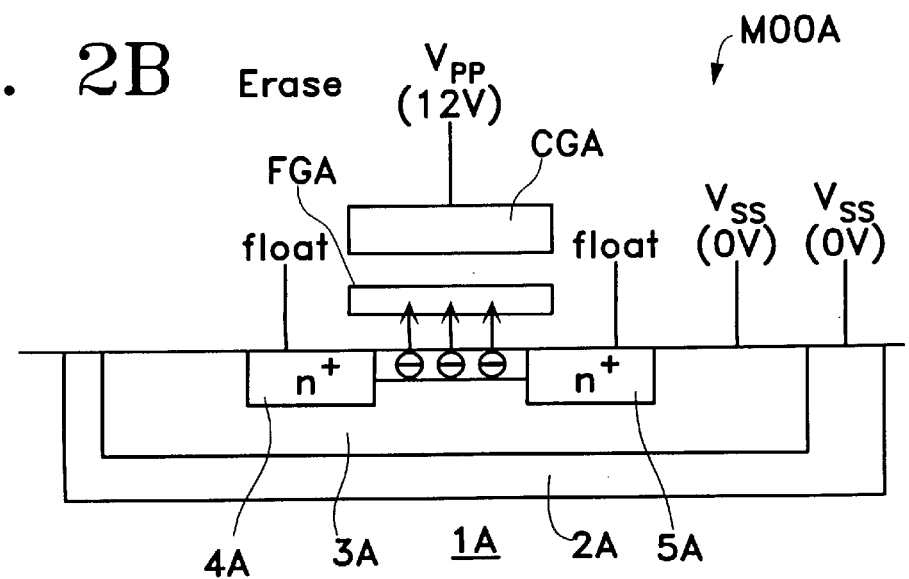

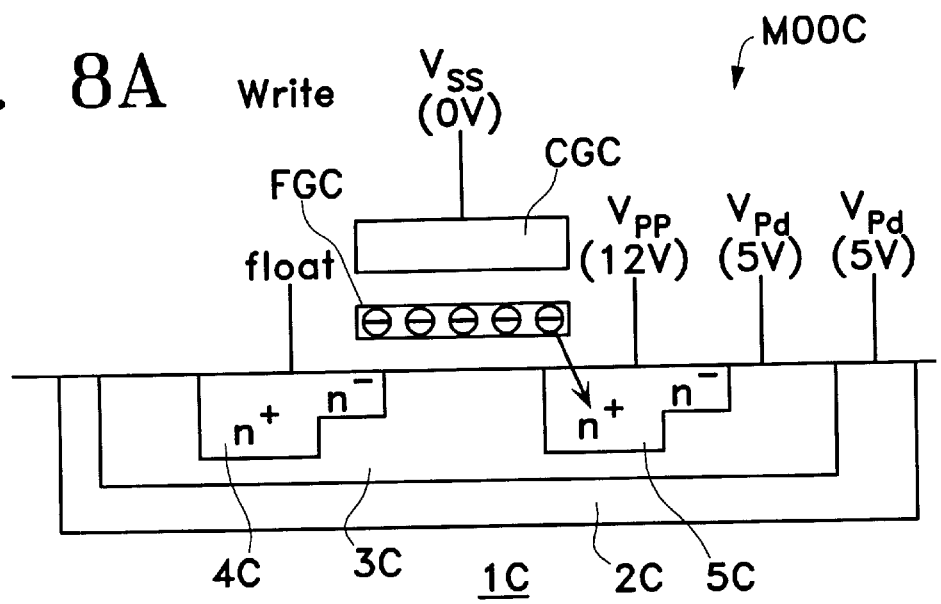
FIG. 8A Write
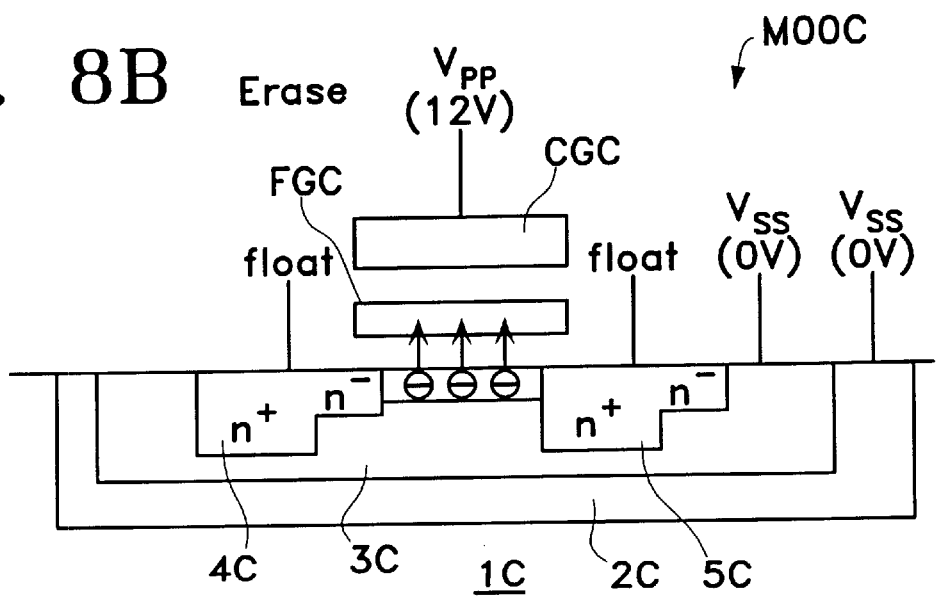
FIG. 8B Erase

FIG. 12A (PIROR ART) Write
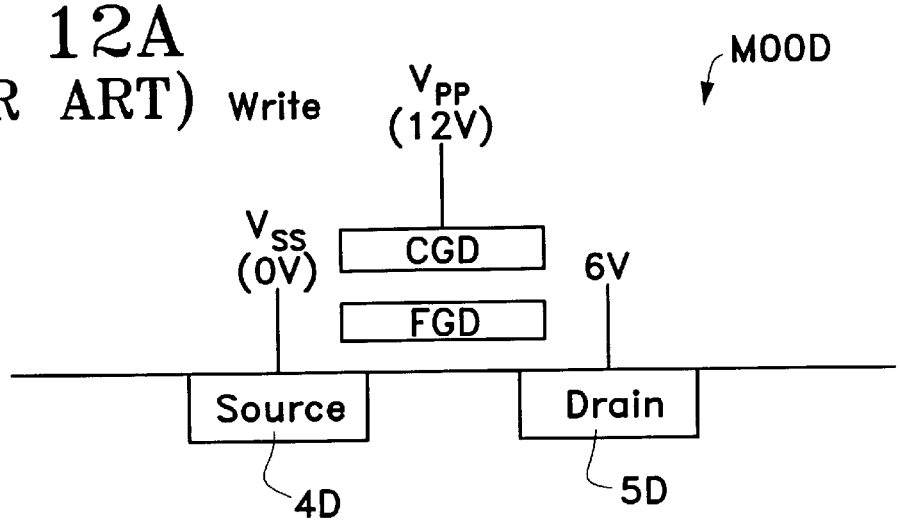
FIG. 12B (PIROR ART) Erase
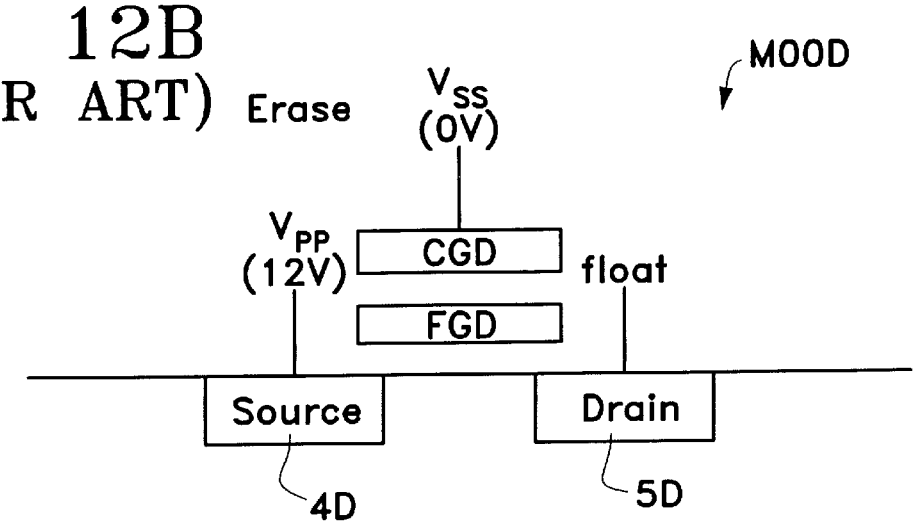
FIG. 12C (PIROR ART) Read
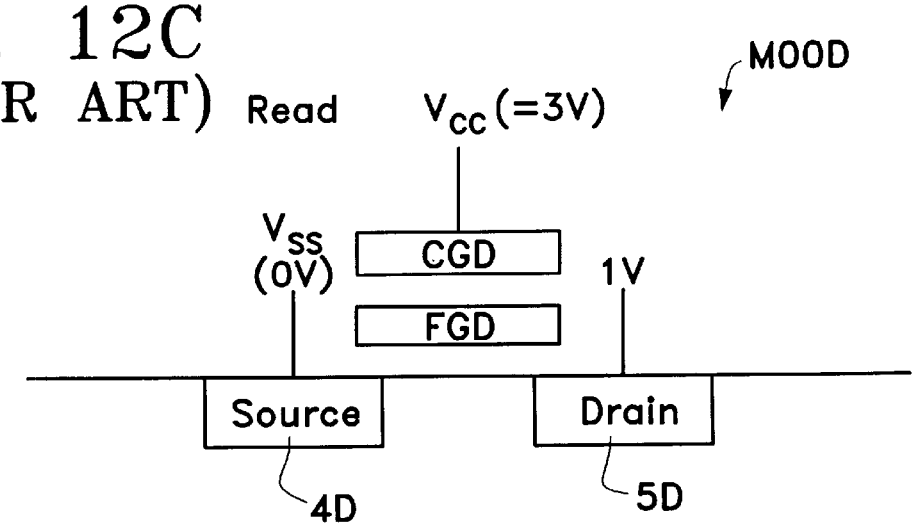

6,067,251

NON-VOLATILE SEMICONDUCTOR MEMORY DEVICE

BACKGROUND OF THE INVENTION

1. Field of the invention

The present invention relates to a non-volatile semiconductor memory device. In particular, the present invention relates to a non-volatile memory device which is capable of writing and erasing data in an FN—FN operation by applying only positive voltages, thereby eliminating the need for a negative voltage pump and reducing the area occupied on a semiconductor chip.

2. Description of the Related Art

In recent years, logic LSIs incorporating different types of memory devices, e.g., DRAMs and flash memories, have attracted much attention. Among others, flash memories are capable of electrical rewriting and retaining data even after the supply of power is terminated. Therefore, flash memories are often utilized for storing internal data (defined below) as well as storing programming codes.

Flash memories for storing internal data are used for storing data during the operation of a logic LSI. It is advantageous to configure such a memory so as to function on only one voltage supply level. Rewriting data stored in the flash memories based on only one voltage supply level requires the use of a step-up pump. Fortunately, this class of flash memories allow the incorporation of a step-up pump because such memories generally have a large capacity and therefore occupy a large area on the chip; against such a large chip area, the typical area occupied by a step-up pump would be substantially negligible.

On the other hand, flash memories for storing programming codes will perform a rewrite operation only at the time of updates (as required, for example, when updating a programming into a subsequent and improved version). Thus, this class of flash memories undergo only a small number of rewrite operations, and also have a small capacity. Since the memory cell array incorporated in such memories will occupy a relatively small area on the chip as compared to what would be occupied by a step-up pump, it may be impossible to incorporate a step-up pumps which is essential for realizing a configuration which uses only one voltage supply level (hereinafter referred to as a "single supply-level configuration").

For the above reason, it may not be preferable with flash memories for storing programming codes to adopt a single supply-level configuration based on a step-up pump. Rather, it may be preferable to adopt a two supply-level configuration by introducing a high voltage (which is required for rewriting) from outside the memory, in addition to a logic voltage.

There is a class of flash memories which employ an FN—FN operation for rewriting data. Such a flash memory provides the following advantages:

(1) the chip area of the non-volatile memory device can be reduced; and (2) since a minute current (called an "FN tunnel current") is used for rewriting data, a smaller power consumption can be attained than by performing rewrite operations based on channel hot electrons, which would require a large current and hence result in a large power consumption.

With reference to FIG. 4A, the structure of a conventional flash memory FM4 will be described. The flash memory FM4 includes a flash memory array 10A, a row decoder 111, a column decoder 112, and a power supply section 115. The power supply section 115 includes a regulator circuit 13 and a negative voltage pump 14. The regulator circuit 13 regulates a voltage Vpp, which is supplied from an external voltage source (not shown), to a voltage Vpd, which in turn is supplied to the column decoder 112. The negative voltage pump 14 converts the voltage Vpp supplied from the external voltage source (not shown) to a negative voltage Vneg, which in turn is supplied to the row decoder 111. The power supply section 115 supplies the voltage Vpp from the external voltage source to the row decoder 111. Thus, the negative voltage pump 14 in the power supply section 115 is a requirement for the conventional flash memory FM4 in order to enable supply of the negative voltage Vneg to the row decoder 111.

Below are several examples of representative flash memories which perform rewriting based on the FN-FN operation:

(1) NOR type flash memories;

(2) NAND type flash memories;

(3) DINOR type flash memories;

(4) AND type flash memories;

(5) ACT (Asymmetrical Contactless Transistor) type (=virtual grounding type) flash memories; and (6) FLTOX type flash memories.

Next, the operation principle and problems of each of the above flash memories will be described.

It is to be understood that each of the flash memories described below has a "stack gate type" memory cell structure. As used herein, a "stack gate type", memory cell is defined as a memory cell which is composed essentially of one transistor, whereas a "split gate type" memory cell refers to a memory cell which is composed essentially of two transistors.

First, write, read, and erase operations for a memory cell M00D of the NOR type will be described with reference to FIGS. 12A to 12C.

With reference to FIG. 12A, a write operation occurs as follows. A voltage Vpp (e.g., 12 V) is applied to a control gate CGD while applying e.g., 6 V to a drain 5D and e.g., 0 V to a source 4D. As a result of applying these high voltages to the control gate CGD and the drain 5D, a current is allowed to flow through the memory cell M00D. At this time, some of the electrons flowing through the memory cell M00D are accelerated by a high-level electric field in the vicinity of the drain 5D so as to be injected into a floating gate FGD, which may be referred to as "injection of channel hot electrons".

With reference to FIG. 12D, an erase operation occurs as follows. Zero volts are applied to the control gate CGD while applying a floating potential to the drain 5D and Vpp (e.g., 12 V) to the source 4D. As a result, electrons are extracted from the floating gate FGD, thereby lowering the threshold value of the memory cell M00D.

A flash memory cell can enter either a state where its floating gate has excess electrons or a state where the floating gate does not have excess electrons. The potential of a floating gate having excess electrons becomes lower than that of a floating gate not having excess electrons. Since a lower potential of the floating gate ultimately requires a higher control gate voltage, a memory cell whose floating gate has excess electrons is said to have a "higher" threshold value.

With reference to FIG. 12C, a read operation occurs as follows. A voltage Vcc (e.g., 3 V) is applied to a control gate CGD while applying 1 V to the drain 5D and 0 V to the source 4D. If the selected memory cell M00D has a low threshold value, a current flows therethrough; if the selected memory cell M00D has a high threshold value, no current flows therethrough.

In an NOR type flash memory, the diffusion layer defining the source is required to have a high withstand voltage because, as described above, a high potential is applied to the source 4D during erasure of data. This in turn requires a deep diffusion, which prevents reduction of the cell area. This also results in the problem of large power consumption during writing.

Table 1 describes the respective voltages applied during writing, erasure, and reading to the NOR type flash memory cell M00D:

TABLE 1

|       | drain | gate | source |
|-------|-------|------|--------|
| write | 6 V   | 12 V | 0 V    |
| erase | F     | 0 V  | 12 V   |
| read  | 1 V   | 3 V  | 0 V    |

F: floating state

Next, the problems associated with NAND type flash memories will be described Due to their NAND array configuration, NAND type flash memories provide the advantage of reducing the chip area occupied by the array; however, they also have a disadvantage in that the array configuration necessitates a high capacitance associated with the bit lines, resulting in slow random access. Therefore, NAND type flash memories are not suitable for storing programming codes where high speed random access is required.

DINOR type flash memories, AND type flash memories, and ACT type flash memories are fundamentally based on the NOR array configuration, which allows for high speed random access. Hereinafter, the fundamental operation principles of these types of flash memories will be described.

First, a DINOR type flash memory is disclosed in "A 3 V single supply-level DINOR type flash memory", Journal of Institute of Electronics, Information and Communication Engineers of Japan, 1993 SDM93, p.15.

FIG. 1 illustrates the structure of a memory cell M00A of a DINOR type flash memory. FIG. 1 is also a general illustration of a flash memory M00A to which the present invention is applicable, as described later.

As shown in FIG. 1, a generally U-shaped n well 2A is formed on the surface of a substrate 1A. In the substrate 1A, a p well 3A is formed. Within the p well 3A, an n+ source 4A and an n+ drain 5A are formed. Upon the portion of the substrate 1A between the source 4A and the drain 5A, a floating gate FGA is formed, with a tunnel oxidation film 6A interposed therebetween. On the floating gate FGA, a control gate CGA is formed with an interlayer insulation film 7A interposed therebetween.

Next, the operation principles of DINOR type memories will be described.

With reference to FIG. 13A, a write operation occurs as follows in the DINOR type memory cell of FIG. 1. A reference voltage vss (e.g., 0 V) is applied to the p well 3A, while applying a negative voltage Vneg (e.g., −8 V) to the control gate CGA and a high positive voltage Vpd (e.g., 4 V) to the drain 5A. As a result, a high level electric field, is generated in a portion where the drain 5A overlays the floating gate FGA, so that electrons are extracted from the floating gate FGA. As a result, the threshold value is lowered (which may be between 0 V and 1.5 V).

With reference to FIG. 13B, an erase operation occurs as follows in the DINOR type memory cell of FIG. 1. Since a negative voltage Ven (e.g., −4 V) is applied to the source 4A, a negative voltage Ven (e.g., −4 V) is applied to the p well 3A so as to prevent a forward voltage from being applied between the substrate 1A and the source 4A. Furthermore, a high positive voltage Veg (e.g., 8 V) is applied to the control gate CGA so as to generate a high level electric field in the source 4A and a channel portion CHA. Electrons are injected into the floating gate FGA from all areas of the channel portion CHA, thereby increasing the threshold value (which may be e.g., 4 V).

With reference to FIG. 13C, a read operation occurs as follows in the DINOR type memory cell of FIG. 1. One volt is applied to the drain 5A and 3 V are applied to the control gate CGA, so as to allow a current to flow through the memory cell M00A. If the memory cell M00D is a "written" memory cell, i.e., has a low threshold value, a current flows therethrough; if the memory cell M00D has a high threshold value, no current flows therethrough. Thus, these states are sensed by a read circuit including sense amplifiers and other elements, whereby the stored data can be read.

Table 2 describes the respective voltages applied during writing, erasure, and reading to the DINOR type flash memory cell M00A:

TABLE 2

|       | drain | gate | source | well |
|-------|-------|------|--------|------|
| write | 4 V   | −8 V | F      | 0 V  |
| erase | F     | 8 V  | −4 V   | −4 V |
| read  | 1 V   | 3 V  | 0 V    | 0 V  |

F: floating state

Next, the above operations are described in more detail, with reference to the structure of a flash memory array 10A shown in FIG. 14. As shown in FIG. 14, the flash memory array 10A includes bit lines BL (BL0 to BLm+1) coupled to drains 5A of memory cells M (M00A to MnmA) in the illustrated manner and word lines WL (WL0 to WLn) coupled to control gates CGA, with the memory cells M being provided in a matrix so as to correspond to the respective intersections between the bit lines BL and the word lines WL. Sources 4A are coupled to a common source SL.

First, the write operation will be described. In a DINOR type flash memory, writing is simultaneously performed for a plurality of memory cells coupled to a single word line WL, whereby the writing speed is enhanced.

FIG. 15 illustrates a state where the respective voltages are applied to the DINOR type flash memory. As shown in FIG. 15, when writing data "1", "0", "1", . . . , "0" to the memory cells M00 to M0m. coupled to the word lines WL0, the selected word line WL0 is −at 8 V, and the unselected word lines WL1, WL2, . . . are at the reference voltage Vss (e.g., 0 V).

The bit lines BL have different voltages depending on the data. When the data to be written is "1", a write voltage 4 V is output to the bit line BL. When the data is "0", the reference voltage Vss (e.g., 0 V) is output to the bit line BL so as to prevent writing. As a result, only the memory cells corresponding to data "1" have their threshold values lowered through the above-described mechanism.

An erase operation occurs so as to erase all of the memory cells in the memory cell array shown in FIG. 14, Specifically, the bit lines BL are placed in a floating state, and −4 V is applied to the p wells 3A and the common source SL. By applying 8 V to all of the word lines WL, electrons are injected to the floating gate FGA through the above-described mechanism, thereby increasing the threshold values of the memory cells.

A read operation occurs by applying 3 V only to the selected word lines WL0 and 0 V to the unselected word lines WL1 to WLn. A current is allowed to flow through each memory cell M to be read by applying 1 V to the drain thereof and 0 V to the common source.

Next, the fundamental operation principles of an AND type flash memory will be described. An AND type flash memory is disclosed in "AND type cells for a 3 V single supply-level 64 Mbit flash memory", Journal of Institute of Electronics, Information and Communication Engineers of Japan, 1993 SDM93, p.37, as well as Japanese Laid-open Publication No. 6-77437.

The operations of the AND type flash memories are fundamentally the same as those of the aforementioned DINOR type flash memories. The following description will be directed only to the differences therebetween.

The structure of the AND type flash memories disclosed in the above literature does not adopt a double well structure, i.e., a structure in which a p well is provided in a region surrounded by an n well, because the disclosed technique does not apply a negative voltage to the drain during erasure (as described later), eliminating the need for a double well structure.

Table 3 describes the respective voltages applied during writing, erasure, and reading to an AND type flash memory:

TABLE 3

|       | drain | gate  | source | well |
|-------|-------|-------|--------|------|
| write | 4 V   | -8 V  | F      | 0 V  |
| erase | F     | 12 V  | F      | 0 V  |
| read  | 1 V   | 3 V   | 0 V    | 0 V  |

F: floating state

The write and read operations of the AND type flash memories are performed by similarly applying voltages as in the case of write and read operations of the aforementioned DINOR type flash memories. Therefore, the description thereof is omitted.

The erase operation is different from that of the DINOR type flash memories. FIG. 13D illustrates the mechanism of the erase operation for memory cells M00D in an AND type flash memory. As shown in FIG. 13D, the drain 5B and the source 4B are placed in a floating state and a positive voltage is applied to word lines WL so as to generate a high level electric field between a channel portion CHB and a floating gate FGB, whereby electrons are injected into the floating gate FGB. As a result, the threshold value of the memory cell is increased.

In the AND type flash memories disclosed in the above literature, the bit lines and the source lines are divided by means of selection transistors (not shown) in order to perform writing and erasure for each single word line. Erasure for a single word line occurs by applying a high positive voltage Vpp (e.g., 12 V) to the selected word line so that electrons are injected into the floating gate FGB as described above. By applying the high positive voltage Vpp (e.g., 12 V) to all of the word lines in the entire memory cell array, it is possible to erase all data in the entire memory array, as in the case of the DINOR type flash memories.

Next, the fundamental operation principles of an ACT type flash memory will be described. An ACT type flash memory is disclosed in "A New Cell Structure for Sub-quarter Micron High Density Flash Memory", IEDM Tech. Dig., p. 267 (1995).

The fundamental operations of the ACT type flash memories slightly differ from those of the DINOR type flash memories and the AND type flash memories because the ACT type flash memories employ a virtual grounding type array in order to reduce the chip area of the memory cell array.

FIG. 6 is a cross-sectional view showing a memory cell M00C in an ACT type flash memory. FIG. 6 is also a general illustration of a flash memory M00C to which the present invention is applicable, as described later.

As shown in FIG. 6, the impurity density of a source 4C and a drain 5C each has a different distribution in a region immediately underlying the floating gate FGC from that in the other regions. The component elements corresponding to those illustrated in FIG. 1 are denoted by the same reference numerals as used therein, with the description thereof omitted.

With reference to FIG. 16A, a write operation occurs as follows in the ACT type memory cell of FIG. 6. A negative voltage Vneg (e.g., -8 V) is applied to the control gate CGC while applying a high positive voltage Vpd (e.g., 4 V) to a high-density diffusion layer (denoted as n+) of the drain 5C. As a result, electrons are extracted through the mechanism shown in FIG. 16A, whereby the threshold value is lowered. Thus, date is written to the memory cell.

On the other hand, electrons are not extracted in the low density region (denoted as n-) of the source 4C responsive to the application of the positive voltage Vpd, so that the threshold value is not lowered. Thus, writing is prevented there.

Next, the write operation will be described in more detail with reference to FIG. 7, which illustrates the relationship between one memory cell and an adjoining memory cell. As can be seen from FIG. 7, each source 4C or drain 5C forming one diffusion layer (n+, n-) is shared by two adjoining memory calls M00C. That is, a diffusion layer (n+, n-) which serves as a drain 5C of one memory cell M00C serves as a source 4C of an adjoining memory cell M00C.

When data is written to one memory cell M00C, the positive voltage VPd (e.g., 4 V) is applied to the drain 5C, while Vpd or a voltage for preventing writing may be applied to the source 4C. In order to allow the write operation to this memory cell to occur when a voltage for preventing writing is applied to the source 4C, its associated diffusion layer (n+, n-) must be placed in a floating state.

With reference to FIG. 16B, an erase operation occurs as follows in the ACT type memory cell of FIG. 6. A negative voltage Vne (e.g., -4 V) is applied to the diffusion layer (source 4C or the drain 5C) and the p well 3C, while applying Veg (e.g., 8 V) to the control gate CGC. As a result, a high level electric field is generated between a channel portion CHC and the floating gate FGC, whereby electrons are injected into the floating gate FGC.

A read operation occurs as follows in the ACT type memory cell of FIG. 6. A voltage Vbs (e.g., 1 V) is applied to the drain 5C (or the source 4C) and Vcc (e.g., 3 V) is applied to the control gate CGC. Thus, a current is allowed to flow through the memory cell M00C, which is sensed to effect data reading.

Table 4 describes the respective voltages applied during writing, erasure, and reading to an ACT type flash memory:

TABLE 4

|       | drain | gate | well |
|-------|-------|------|------|
| write | 4 V   | −8 V | 0 V  |
| erase | −4 V  | 8 V  | −4 V |
| read  | 1 V   | 3 V  | 0 V  |

F: floating state

Next, these operations will be described in more detail with reference to FIG. 17, which illustrates the structure of a memory cell for use in an ACT type flash memory 10C. With respect to the memory cells disposed along the same word line WL in FIG. 17, one bit line BL is shared by two adjoining memory cells. For example, the bit line BL1 is coupled to both of the memory cells M00 and M01.

The write operation for this memory cell array will be described. As in the case of the aforementioned DINOR type flash memories and AND type flash memories, writing is simultaneously performed for a plurality of memory cells coupled to a single word line WL.

FIG. 17 shows the voltages applied to the respective nodes in the array in the case where the data to be written are "1", "0", "1", . . . , and "0". When writing to the memory cells M00 to M0m, which are coupled to the word line WL0, a voltage Vnn (eg., −8 v) is applied to the word line WL0, while the bit lines BL0, BL1, BL2, . . . , BLn are retained at, respectively, 4 V, a floating potential, 4 V, . . . , and a floating potential. Thus, the aforementioned data are written to the array.

In an erase operation, all of the memory cells in the memory cell array are to be erased by applying −4 V to all of the bit lines BL0 to BLm+1 and 8 V to all of the word lines WL0 to WLn. Thus, electrons are injected at the floating gate FGC through the aforementioned mechanism, thereby increasing the threshold value.

A read operation occurs as follows, by applying 3 V to selected word lines WL and 0 V to unselected word lines. Specifically, Vbs (e.g., 1 V) is applied to the drain of any memory cell to be read, while applying Vss (e.g., 0 V) to the source thereof, so that a current will flow through the memory cell. For example, the data stored in the memory cell M00C can be read by applying Vcc (e.g., 3 V) to the word line WL0: Vbs to the bit line BL0; and Vss to the bit line BL1.

Next, the fundamental operation principles of an FLTOX type flash memory will be described. FIG. 19 illustrates the structure of a memory cell M00E in an FLTOX type flash memory. In a surface layer of a substrate 1E, an n+ source 4E and an n+ drain 5E are formed. A floating gate FGE is formed with a field oxidation film 6E interposed therebetween. On the floating gate FGA, a control gate CGE is formed with an interlayer insulation film 7E interposed therebetween.

An FLTOX type flash memory having the above structure is disclosed in "16 kb Electrical Erasable Non-volatile Memory", IEEE ISSCC Dig. Tech. Pap; pp.152–153 (1980), for example.

An application of a flash memory having the above cell structure in a memory cell array 10E shown in FIG. 20 will be described. This type of flash memory does not have a double well structure, and the well and the substrate 1 are always maintained at the same potential, i.e., Vss (e.g., 0 V).

A write operation occurs as follows. A voltage Vss is applied to the control gate CGE, and Vpp (e.g., 12 V) is applied to the bit line BL when data "1" is to be written to the memory cell. As a result, a high level electric field is generated between a floating gate FGE and the drain 5E, whereby electrons are extracted at the floating gate FGE, lowering the threshold value.

When writing data "0" is to memory cell, a voltage Vinh (e.g., 6 V) is applied to the bit line BL. As a result, the electric field between the floating gate FGE and the drain 5E is reduced, whereby the threshold value is maintained at a high level.

In order to avoid so-called drain disturbance, Vinh is applied to the unselected word lines WL.

An erase operation occurs as follows. The voltage Vpp is applied to all of the word lines WL in the selected memory cell array, while applying 0 V to the bit lines BL and placing the source lines in a floating state. Thus, electrons are injected from the drain 5E side so as to increase the threshold value.

Table 5 describes the respective voltages applied during writing, erasure, and reading to an FLTOX type flash memory:

TABLE 5

|       | drain | gate | source | well |
|-------|-------|------|--------|------|
| write | 12 V  | 0 V  | F      | 0 V  |
| erase | 0 V   | 12 V | F      | 0 V  |
| read  | 1 V   | 3 V  | 0 V    | 0 V  |

F: floating state

The aforementioned DINOR type flash memories, AND type flash memories, and ACT type flash memories, all of which function based on the FN—FN operation, utilize negative voltages for the write and erase operations in order to facilitate a single supply-level configuration Such negative voltages are generated in an internal negative voltage pump. In addition, these operations also require high positive voltages, which are also internally generated by using a step-up pump.

As described above, logic LSIs incorporating different kinds of flash memories for storing programming codes are designed to have a relatively small memory capacity. Therefore, it is difficult to use a step-up pump and/or a negative voltage pump, which would occupy large chip areas.

Moreover, the only externally suppliable voltage, which is needed in addition to a logic voltage, is a high voltage from an external high voltage source (which is required for rewriting). In other words, it is impossible to externally supply a negative voltage to the DINOR type flash memories, AND type flash memories, and ACT type flash memories.

The FLTOX flash memories have the following problems:

(1) As illustrated in FIG. 19, the floating gate FGE has a complicated structure and therefore a large size. This makes it difficult to minimize the cell area.

(2) It is necessary to ensure that drains 5E have a high withstand voltage because a high voltage will be applied thereto. This inevitably results in a large drain region and a large call area.

Thus, the FLTOX type flash memories require an even larger cell area than that required for ETOX type flash memories. Therefore, minimization of the cell area, which is supposed as an advantage associated with flash memories based on the FN—FN operation, cannot be adequately attained.

SUMMARY OF THE INVENTION

A non-volatile semiconductor memory device includes: a matrix of word lines and bit lines intersecting one another;

and a memory cell of a stack gate type being disposed so as to correspond to each intersection of the matrix of the bit lines and the word lines, the memory cell including a control gate, a drain, and a source, the control gate being coupled to a corresponding one of the word line, the drain being coupled to a corresponding one of the bit lines, and the memory cell being capable of performing a write operation and an erase operation based on an FN tunnel phenomenon, wherein data is written to the memory cell by applying a reference voltage to the control gate, a first voltage to a well in which the memory cell is formed, and a second voltage to the drain, data is erased from the memory cell by applying a third voltage to the control gate and the reference voltage to the well, each of the first, second, and third voltages being equal to or greater than zero volts, and the second voltage being greater than the first voltage.

In one embodiment of the invention, the source is coupled to a common source.

In another embodiment of the invention, the source is coupled to one of the bit lines associated with a memory cell adjoining the memory cell.

In still another embodiment of the invention, the non-volatile semiconductor memory device further includes a power supply section for supplying a voltage to the control gate, the well, and the drain, wherein, when writing data to the memory cell, the power supply section applies the reference voltage to the control gate, the first voltage to the well, and the second voltage to the drain; and wherein, when erasing data form the memory cell, the power supply section applies the third voltage to the control gate and the reference voltage to the well.

In still another embodiment of the invention, the power supply section receives the second voltage and the reference voltage from a single external voltage source; and the power supply section includes a regulator circuit for regulating the second voltage to the first voltage and the third voltage.

In still another embodiment of the invention, the power supply section receives the first voltage, the second voltage, the third voltage, and the reference voltage from external voltage sources.

In still another embodiment of the invention, the second voltage and the third voltage are equal.

In still another embodiment of the invention, when writing data to the memory cell, the first voltage is applied to at least one of the word lines associated with an unselected memory cell.

In still another embodiment of the invention, the well is formed of a p-type semiconductor layer, the well being surrounded by an n-type semiconductor layer so as to be electrically isolated from a substrate; and the first voltage is supplied to the n-type semiconductor layer when writing data to the memory cell.

In still another embodiment of the invention, each memory cell includes a floating gate formed between the control gate and the drain/source, an interlayer insulation film being formed between the floating gate and the control gate, and the floating gate having a flat shape.

In accordance with the above configuration, write and erase operations for the flash memory (non-volatile semiconductor memory device) based on the FN-FN operation of the present invention can be performed by applying positive voltages and without applying negative voltages. As a result, as seen from the comparative illustration in FIGS. 4A and 4B, the voltage system of the flash memory does not require a negative voltage pump, which is a requirement in the prior art for writing data. As a result, the chip area can be greatly reduced.

In addition, according to the present invention, it is unnecessary to apply a negative voltage to a column decoder 12A and a row decoder 11A, as shown in FIG. 4B. Therefore, the decoder circuitry can be so much simplified.

By adopting a configuration incorporating virtual grounding type memory cells, the chip area can be further reduced.

By applying the first burst mode to the word line of an unselected memory cell during data writing, it becomes possible to omit a regulator circuit as shown in FIG. 5. As a result, the chip area can be further reduced.

Since a negative voltage is not utilized for a write or erase operation according to the present invention, it is unnecessary to employ transistors having a double well structure. As a result, it is possible to reduce the chip area of peripheral circuitry, in particular that required for the row decoder section and the column decoder section.

Since the floating gate can be made flat, its size can be reduced as compared to that in an FLTOX type flash memory. As a result, the chip area can be further reduced.

Thus, the invention described herein makes possible the advantages of (1) providing a non-volatile semiconductor memory device which utilizes a positive voltage for a write operation and an erase operation, without the need for a negative voltage pump, thereby reducing the chip area and relaxing the constraints concerning the withstand voltage on the drain side; and (2) providing a non-volatile semiconductor memory device incorporating a floating gate having a flat shape and a minimum size, thereby further reducing the cell area.

These and other advantages of the present invention will become apparent to those skilled in the art upon reading and understanding the following detailed description with reference to the accompanying figures.

BRIEF DESCRIPTION OF THE DRAWINGS

FIG. 1 is a cross-sectional view illustrating the structure of a memory cell in a flash memory according to Example 1 of the present invention.

FIG. 2A is a cross-sectional view describing a write operation for a memory cell in a flash memory according to Example 1 of the present invention.

FIG. 2B is a cross-sectional view describing an erase operation for a memory cell in a flash memory according to Example 1 of the present invention.

FIG. 8A is a cross-sectional view describing a write operation for a memory cell in a flash memory according to Example 1 of the present invention.

FIG. 8B is a cross-sectional view describing an erase operation for a memory cell in a flash memory according to Example 1 of the present invention.

FIG. 12A is a cross-sectional view schematically describing a write operation for a memory cell in a conventional NOR type flash memory.

FIG. 12B is a cross-sectional view schematically describing an erase operation for a memory cell in a conventional NOR type flash memory.

FIG. 12C is a cross-sectional view schematically describing a read operation for a memory cell in a conventional NOR type flash memory.

DESCRIPTION OF THE PREFERRED EMBODIMENTS

Hereinafter, the present invention will be described by way of examples, with reference to the accompanying figures.

EXAMPLE 1

FIGS. 1 to 5 illustrate a non-volatile semiconductor memory device according to Example 1 of the present invention. FIG. 1 illustrates the structure of a memory cell M00A of the non-volatile semiconductor memory device according to Example 1. Example 1 illustrates an embodiment of the present invention as applied to a DINOR type flash memory.

As shown in FIG. 1, a generally U-shaped n well 2A is formed on the surface of a substrate 1A. In the substrate 1A, a p well 3A is formed. Within the p well 3A, an n+ source 4A and an n+ drain 5A are formed. Upon the portion of the substrate 1A between the source 4A and the drain 5A, a floating gate FGA is formed, with a tunnel oxidation film 6A interposed therebetween. On the floating gate FGA, a control gate CGA is formed with an interlayer insulation film 7A interposed therebetween.

It should be noted that the p well 3A, in which the memory cell M00A is constructed, must be formed so as to be surrounded by the n well 2A, defining a double well structure.

Next, the operation principles of the memory cell M00A of according to Example 1 of the present invention will be described with reference to FIG. 2A and 23.

Table 6 describes the respective voltages applied during writing, erasure, and reading to the memory cell M00A:

TABLE 6

|       | drain | gate | source | well |
|-------|-------|------|--------|------|
| write | 12 V  | 0 V  | F      | 5 V  |
| erase | F     | 12 V | F      | 0 V  |
| read  | 1 V   | 3 V  | 0 V    | 0 V  |

F: floating state

With reference to FIG. 2A, a write operation occurs as follows. A high positive voltage Vpd (e.g., +5 V) is applied to the p well 3A, while applying the high positive voltage Vpd to the n well 2A so as to prevent a forward bias from occurring between the p well 3A and the n well 2A. constituting a double well structure. A high positive voltage Vpp (e.g., +12 V) is applied to the drain 5A. Furthermore, the source 4A is placed in a floating state, and a reference voltage Vss (e.g., 0 V) is applied to the control gate CGA. With such applied voltages, a high level electric field is generated in a portion where the drain 5A overlays the floating gate FGA. Due to the high positive voltage Vpd applied to the p well 3A, the constraints concerning the withstand voltage of the drain 5A can be relaxed.

As a result, electrons are extracted from the floating gate FGA, thereby lowering the threshold value. The high positive voltages employed herein are all derived from a single external high voltage source (e.g., 12 V).

Figure 3:
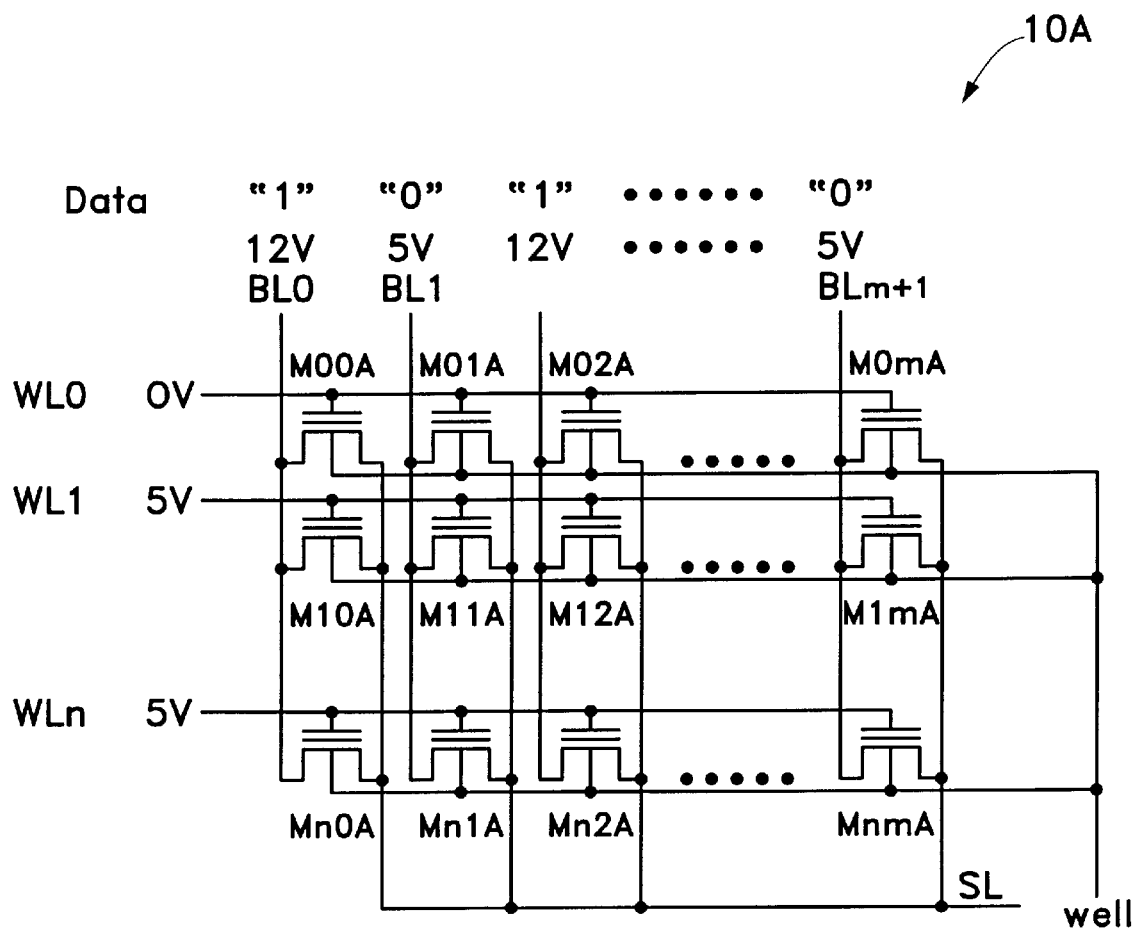
FIG. 3 is a circuit diagram showing the circuitry of a flash memory array and respective write voltages applied thereto according to Example 1 of the present invention.

Next, the respective applied voltages are described with reference to a memory array 10A shown in FIG. 3. As in the case of a conventional DINOR type flash memory, writing is simultaneously performed for a plurality of memory cells coupled to a single word line WL. FIG. 3 illustrates the case where data "1" "0", "1", . . . , "0" are to be written.

FIG. 3 illustrates a state where the respective voltages are applied to the respectively nodes of the memory cell array 10A. When writing to the memory cells M00A to M0mA coupled to a word line WL0, the reference voltage Vss (e.g., 0 V) is applied to the word line WL0, while applying Vpp (e.g., 12 V), Vpd (e.g., 5 V), Vpp, . . . , Vpd to bit lines BL0, BL1, BL2, . . . , BLn.

At this time, the well voltage is Vpd, and a common source SL is placed in a floating state. All of the unselected word lines WL1 to WLn are at Vpd. Thus, the aforementioned data are written to the memory cell array 10A.

Now, the issue concerning what is known as disturbance to those skilled in the art will be described. In FIG. 3, the memory cell M01A is susceptible to so-called gate disturbance, whereas the memory cell M10A is susceptible to so-called drain disturbance. The memory cell M11A and the like are free from disturbance because the control gate CGA, the drain 5A, and the wells 2A and 3A are at Vpd.

Next, the aforementioned gate disturbance and drain disturbance will be described in detail.

(1) Gate disturbance

As mentioned above, gate disturbance refers to the effects of a set of conditions (disturbance conditions) which are received at the memory cell M01A shown in FIG. 3, namely, the word line WL0 being at 0 V, the bit line BL1 being at 5 V, and the substrate 1A being at 5 V. These conditions also would be equivalent to a situation where, based on the voltage of the substrate 1A, the bit line BL1 and the substrate 1A are at 0 V and the word line WL0 is at −5 V.

In the aforementioned prior art technique, the gate disturbance is about −9 V, where about 10 seconds are required for lowering the threshold value by 1 V. According to Example 1 of the present invention, about 1000 seconds are required for lowering the threshold value by 1 V under the above conditions, although this may vary depending on the specific memory cell design. Therefore, the gate disturbance is substantially negligible according to Example 1.

(2) Drain disturbance

As mentioned above, drain disturbance refers to the effects of a set of conditions (disturbance conditions) which are received at the memory cell M10A shown in FIG. 3, namely, the word line WL0 being at 5 V, the bit line BL1 being at 12 V, and the substrate 1A being at 5 V. These conditions would be equivalent to a situation where, based on the voltage of the substrate 1A, the word line WL0 and the substrate 1 are at 0 V and the bit line BL1 is at 7 V.

According to Example 1 of the present invention, about 100 seconds are required for lowering the threshold value by 1 V under the above conditions, although this may vary depending on the specific memory cell design.

Assuming (although not shown in the figure) that the memory cell array includes main bit lines and sub-bit lines such that about 32 memory cells are coupled to each sub-bit line and about 10 msec is required for writing in one memory cell, a disturb time of 300 msec will be incurred. Thus, the invention provides a sufficient margin (which amounts to two orders of magnitude), thereby rendering the drain disturbance also substantially negligible.

The erase and read operations are basically identical with those for the AND type flash memories illustrated in the description of the prior art, and therefore need not be repeated here.

Figure 4A:
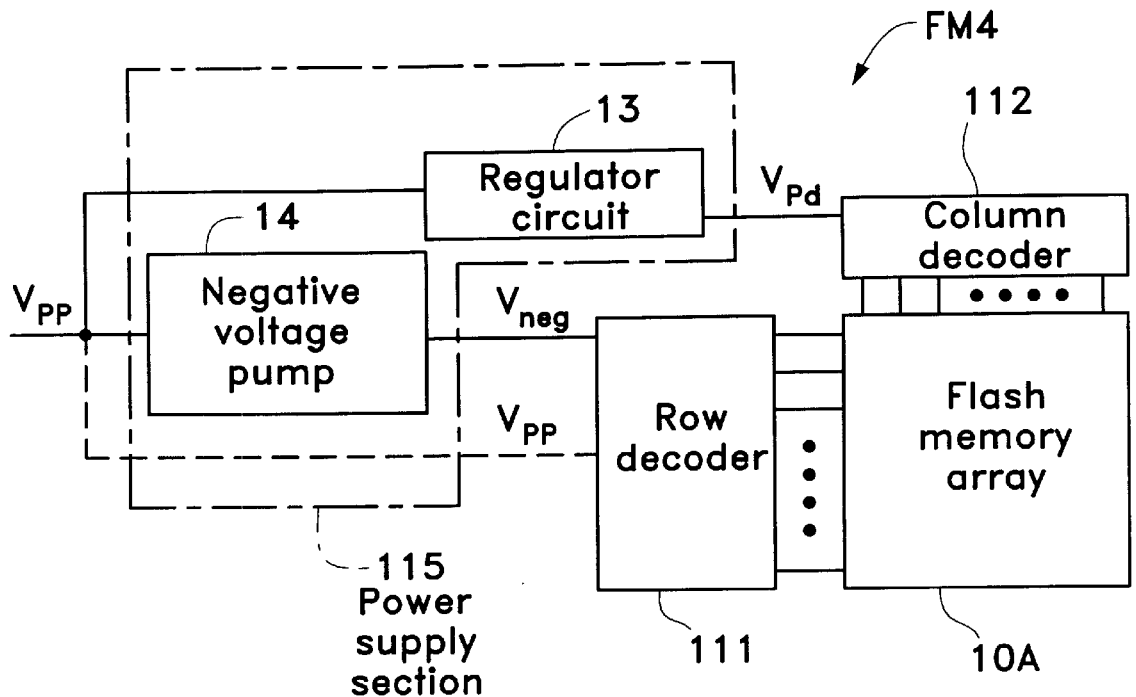
FIG. 4A is a block diagram showing the structure of a conventional flash memory.
Figure 4B:
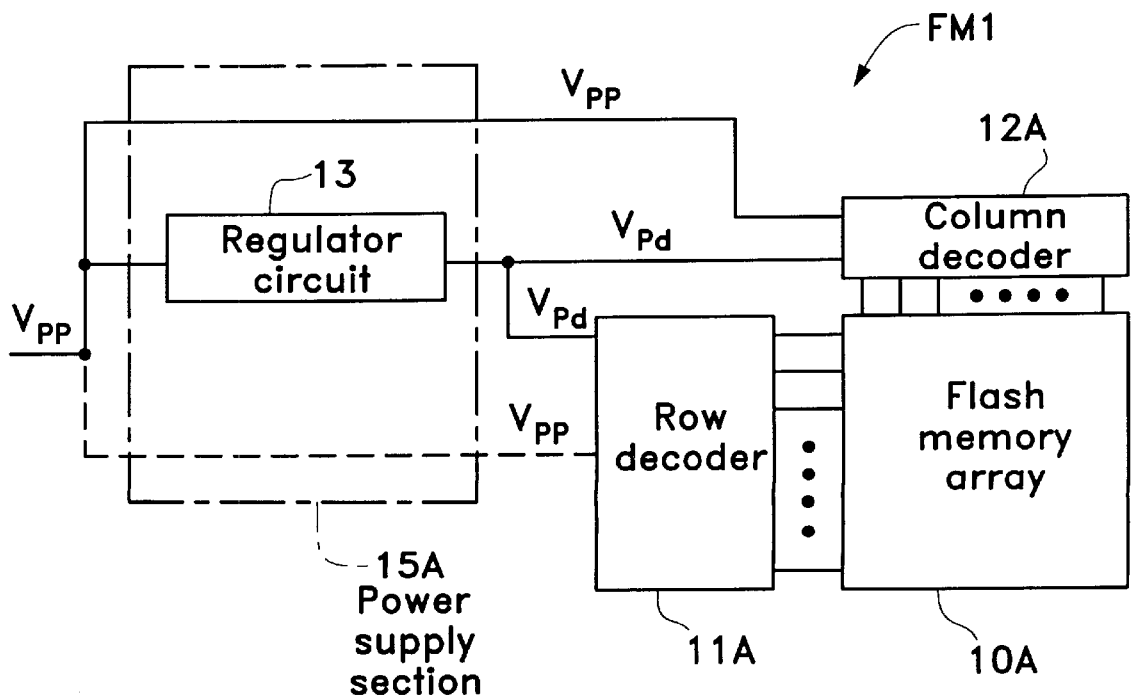
FIG. 4B is a block diagram showing the structure of a flash memory according to the present invention.

Next, the effects attained in accordance with Example 1 over the prior art technique will be described with reference to FIGS. 4A and 4B. FIG. 4A shows the structure of a conventional flash memory, and FIG. 4B shows the structure of the flash memory according to Example 1. The conventional flash memory of FIG. 4A has been illustrated in the description of the prior art techniques and therefore its description is omitted here.

The structure of the flash memory FM1 of the present example will be described with reference to FIG. 4B.

The flash memory FM1 includes a flash memory array 10A, a row decoder 11A, a column decoder 12A, and a power supply section 15A. The power supply section 15A includes a regulator circuit 13. The regulator circuit 13 regulates a voltage Vpp, which is supplied from an external voltage source (not shown), to a voltage Vpd, which in turn is supplied to the column decoder 12A and the row decoder 11A. The power supply section 15A supplies the voltage Vpp from the external voltage source (not shown) to the column decoder 12A and the row decoder 11A. Thus, in accordance with the flash memory FM1 of the present example, it is unnecessary to incorporate a negative voltage pump in the power supply section 15A.

In contrast, the conventional flash memory requires application of a negative voltage, and hence a negative voltage pump 14 as shown in FIG. 4A. Thus, there is a clear structural difference between the flash memory FM1 of Example 1 and conventional flash memories.

During an erase operation, the conventional flash memory FM4 does not employ the negative voltage pump 14 and the regulator circuit 13, but the voltage Vpp from the external power supply Vpp is directly input to the row decoder 11A. Similarly, in accordance with the flash memory FM1 of the present example, the voltage Vpp from the external power supply Vpp is directly input to the row decoder 11A during an erase operation.

Thus, in accordance with the flash memory according to the present example, it is possible to omit a negative voltage pump, which is a requirement in conventional flash memories. As a result, the chip area can be greatly reduced as compared to that required for conventional flash memories.

Furthermore, since no negative voltage is applied to the column decoder 12A or the row decoder 11A, it is possible to accordingly simplify and miniaturize the circuitry of the decoders.

Figure 5:
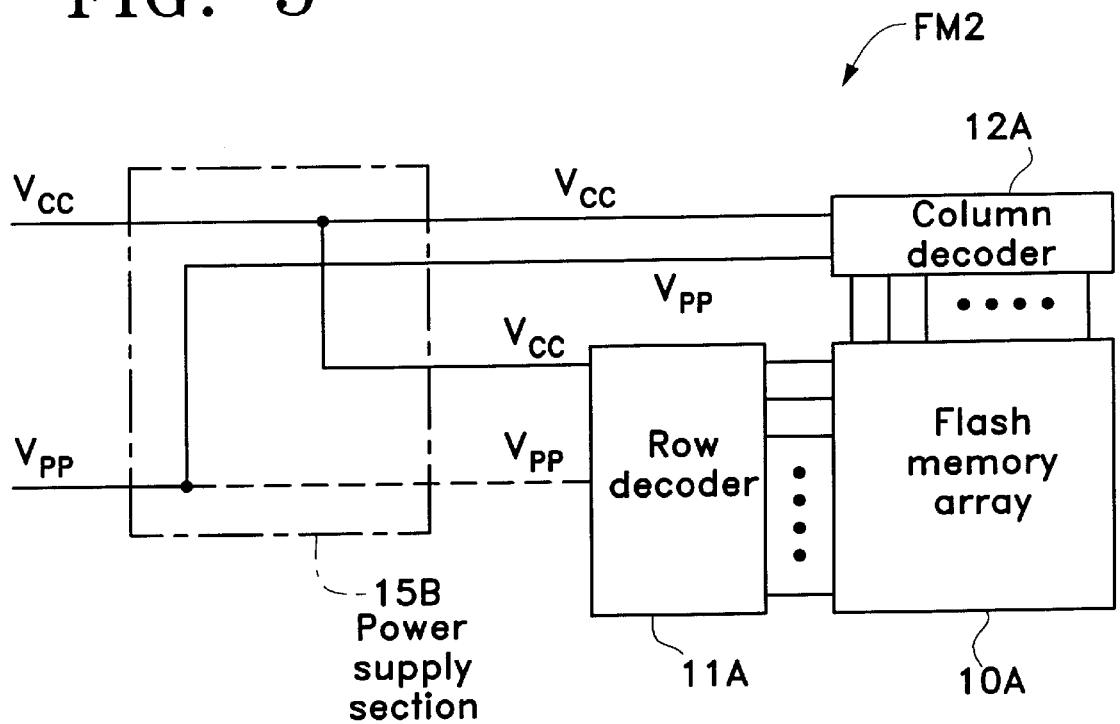
FIG. 5 is a block diagram showing a variant of a flash memory according to the present invention.

Alternatively, the memory cell according to the present example can be configured so as to utilize Vcc (e.g., 3 V) as a voltage to be applied to the wells 2A and 3A, a voltage to be applied to the unselected bit lines BL, and a voltage to be applied to the unselected word lines WL during writing, instead of utilizing Vps. FIG. 5 illustrates the structure of such a flash memory FM2. Since the regulator circuit 13 is omitted, the chip area is further reduced as compared to the flash memory FM1 shown in FIG. 4B.

Table 7 describes the respective voltages applied during writing, erasure, and reading to the flash memory FM2:

TABLE 7

|  | drain | gate | source | well |
|---|---|---|---|---|
| write | 12 V | 0 V | F | 3 V |
| erase | F | 12 V | F | 0 V |
| read | 1 V | 3 V | 0 V | 0 V |

F: floating state

EXAMPLE 2

Figure 6:
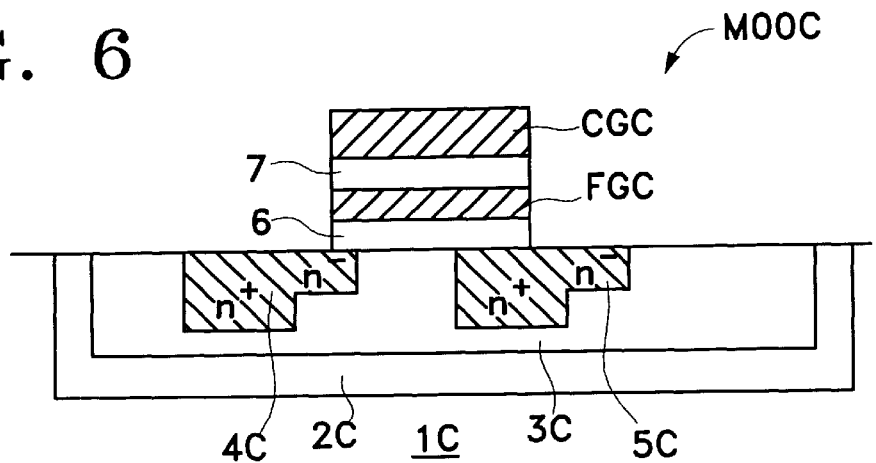
FIG. 6 is a cross-sectional view illustrating the structure of a flash memory according to Example 2 of the present invention.
Figure 7:
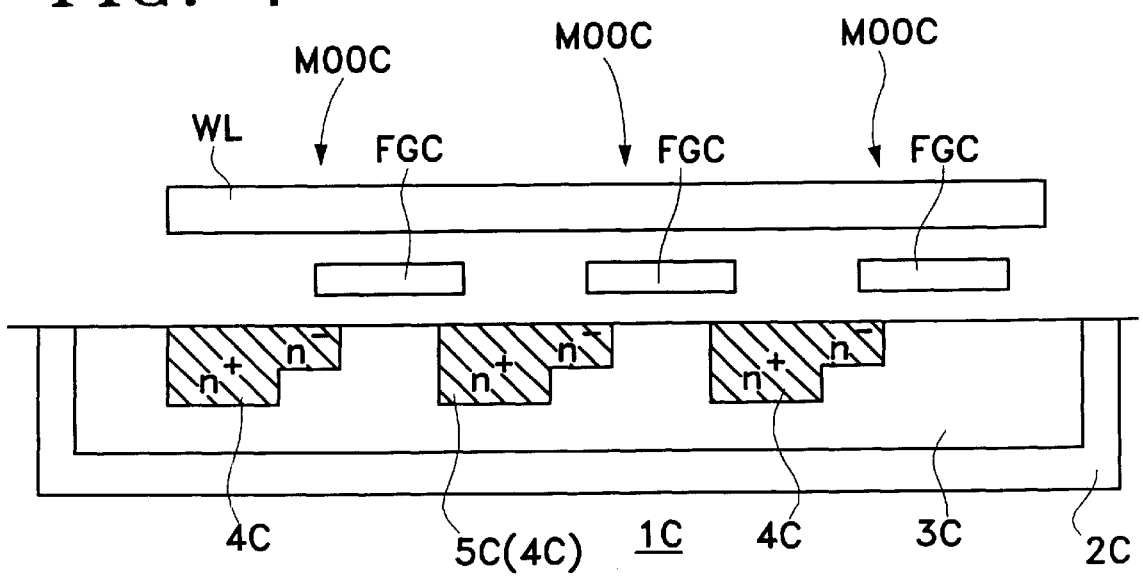
FIG. 7 is a cross-sectional view of a flash memory according to Example 2 of the present invention taken along the word line direction.

FIGS. 6 to 10 illustrate a non-volatile semiconductor memory device according to Example 2 of the present invention. FIGS. 6 and 7 illustrate the structure of a memory cell M00C of the non-volatile semiconductor memory device according to Example 2. Example 2 illustrates an embodiment of the present invention as applied to an ACT type flash memory, i.e., virtual grounding type memory cells. Accordingly, the chip area of the non-volatile semiconductor memory device of the present example is smaller than that of non-volatile semiconductor memory device of Example 1. The component elements which correspond to those described in Example 1 are denoted by the same reference numerals as used therein, and the specific description thereof is omitted.

Now, the fundamental operation principles of the memory cell M00C according to the present example will be described with reference to Table 8, FIGS. 8A and 8B.

Table 8 describes the respective voltages applied during writing, erasure, and reading to the memory cell M00C:

TABLE 8

|       | drain | gate | source |
|-------|-------|------|--------|
| write | 12 V  | 0 V  | 5 V    |
| erase | F     | 12 V | 0 V    |
| read  | 1 V   | 3 V  | 0 V    |

F: floating state

With reference to FIG. 8A, a write operation occurs as follows. A high positive voltage Vpd (e.g., +5 V) is applied to the p well 3C, while applying the high positive voltage Vpd (which may actually be any voltage equal to or higher than Vpd) to the n well 2C so as to prevent a forward bias from occurring between the p well 3C and the n well 2C constituting a double well structure.

A high positive voltage Vpp (e.g., +12 V) is applied to the drain 5C. Since the source 4C shares a bit line BL with the drain 5C of an adjoining memory cell Vpd (e.g., 5 V) or a floating potential is applied to the source 4C. A reference voltage Vss (e.g., 0 V) is applied to the control gate CGC.

With such applied voltages, a high level electric field is generated in a portion where the drain 5C overlays the floating gate FGC. As a result, electrons are extracted from the floating gate FGC, thereby lowering the threshold value. The high positive voltages employed herein are all derived from a single external high voltage source (e.g., 12 V).

Figure 9:
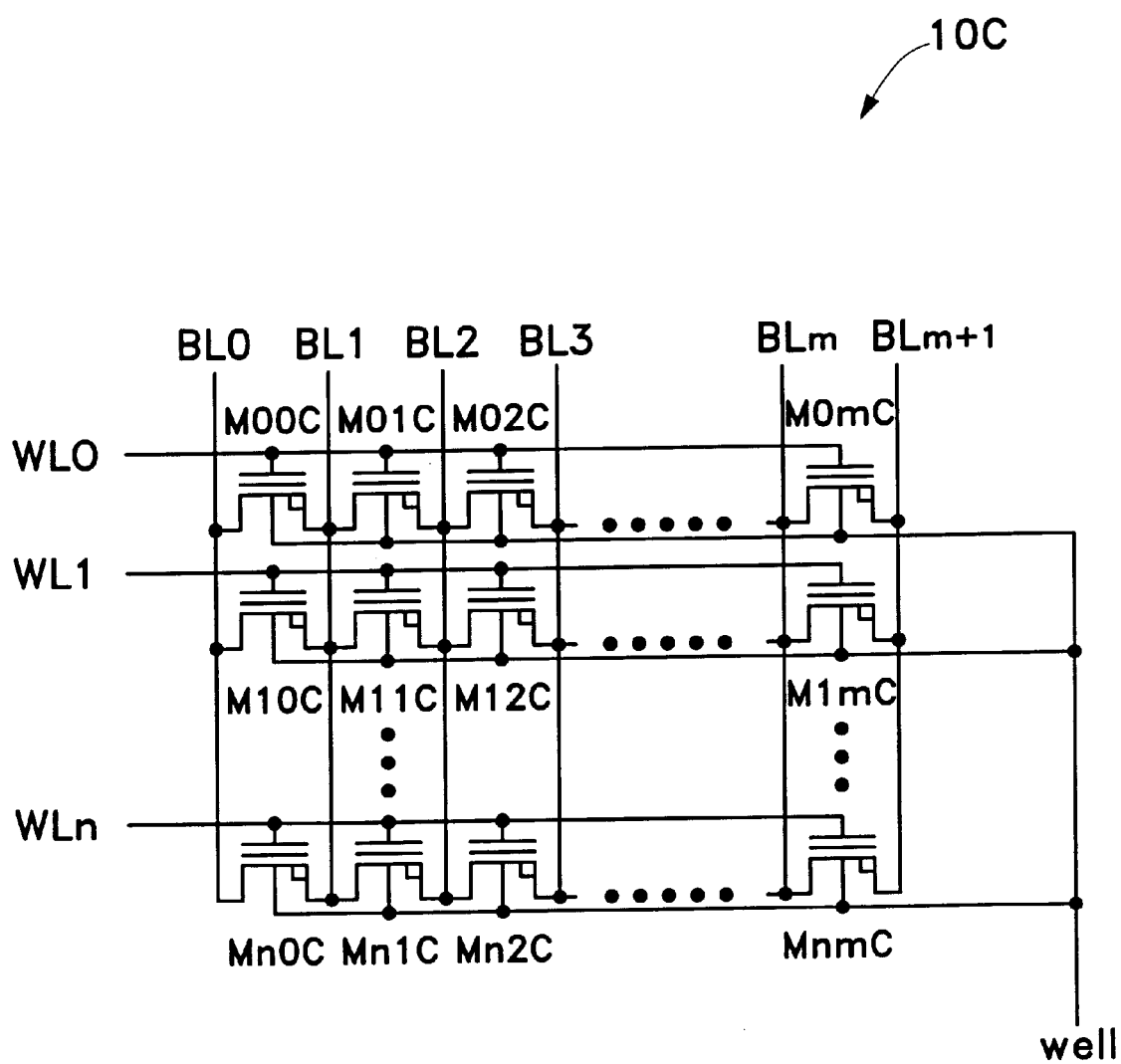
FIG. 9 is a circuit diagram illustrating the structure of a memory cell array of a flash memory according to Example 2 of the present invention.
Figure 10:
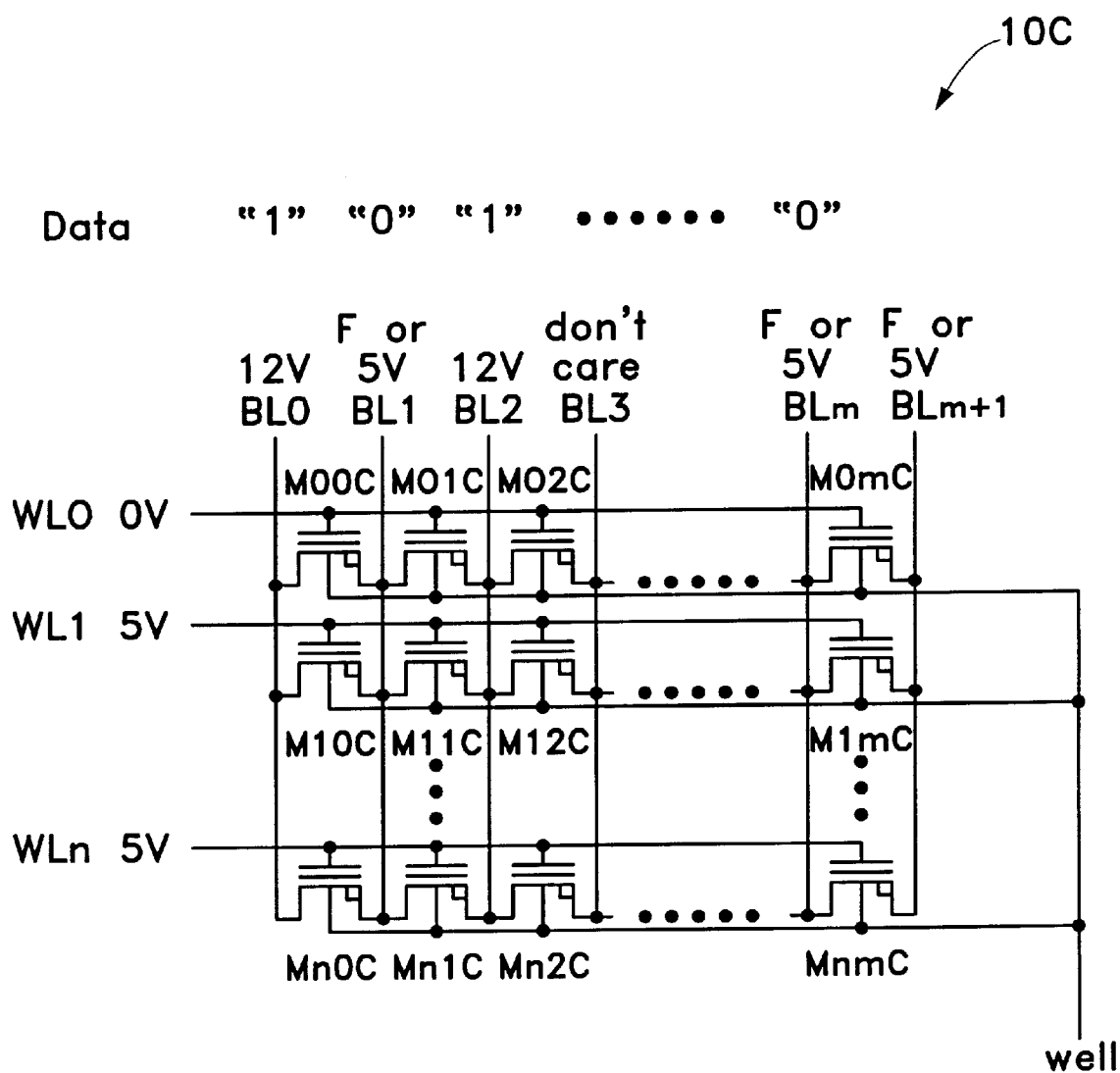
FIG. 10 is a circuit diagram showing the circuitry of a flash memory array and respective write voltages applied thereto according to Example 2 of the present invention.

Next, the respective applied voltages are described with reference to a memory array 10C shown in FIG. 9. As in the case of a conventional ACT type flash memory, writing is simultaneously performed for a plurality of memory cells coupled to a single word line WL. FIG. 10 illustrates the voltages applied to the respective nodes of the memory cell 10C in the case where data "1", "0", "1", . . . , "0" are to be written.

When simultaneously writing data to the memory cells M00C to M0mC coupled to a word line WL0, the reference voltage Vss (e.g., 0 V) is applied to the word line WL0, while applying Vpp (e.g., 12 V), a floating potential or Vpd (e.g., 5 V), Vpp, . . . , a floating potential or Vpd to bit lines BL0, BL1, BL2, . . . , BLn.

At this time, the voltage applied to the wells 2c and 3c is Vpd. All of the unselected word lines WL1 to WLn are at vpd. Thus, the aforementioned data are written to the memory cell array 10c.

The same issue of disturbance discussed in connection with Example 1 applies to Example 2, and the description thereof is omitted.

The erase and read operations are basically identical with those for the ACT type flash memories illustrated in the description of the prior art (see FIG. 8A), and therefore need not be repeated here.

Thus, in accordance with the flash memory according to the present example, it is possible to omit a negative voltage pump (see FIG. 4B), which is a requirement in conventional flash memories. As a result, the chip area according to Example 2, as well as Example 1, can be greatly reduced as compared to that required for conventional flash memories.

Furthermore, in this Example, since no negative voltage is applied to the column decoder 12A or the row decoder 11A, it is possible to accordingly simplify and miniaturize the circuitry of the decoders, as in the case of Example 1.

Alternatively, the memory cell according to the present example, as well as Example 1, can be configured so as to utilize a logic supply voltage Vcc (e.g., 3 V) from a logic power supply as a voltage to be applied to the wells 2A and 3A, a voltage to be applied to the unselected bit lines BL, and a voltage to be applied to the unselected word lines WL during writing, instead of utilizing Vps. Since the regulator circuit 13 is omitted as shown in FIG. 5, the chip area can be further reduced.

Table 9 describes the respective voltages applied during writing, erasure, and reading in the case of adopting the flash memory shown in FIG. 5 in Example 2:

TABLE 9

|       | drain | gate | source | well |
|-------|-------|------|--------|------|
| write | 12 V  | 0 V  | F      | 3 V  |
| erase | F     | 12 V | F      | 0 V  |
| read  | 1 V   | 3 V  | 0 V    | 0 V  |

F: floating state

Another advantage provided according to Examples 1 and 2 is that, since a negative voltage is not utilized for write and erase operations as described above, there is no need to employ a transistor having a double well structure, whereby the chip areas of the peripheral circuitry, especially that required for the row and column decoders can be reduced. Hereinafter, the reasons behind this advantage will be described with reference to the conventional example illustrated in FIGS. 18A and 18B.

Figure 18A:
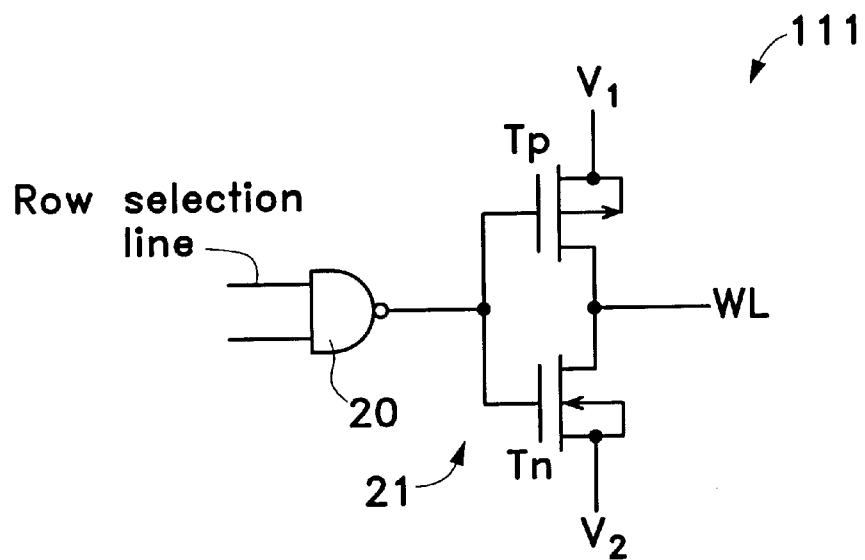
FIG. 18A is a circuit diagram illustrating a conventional row decoder.
Figure 18B:
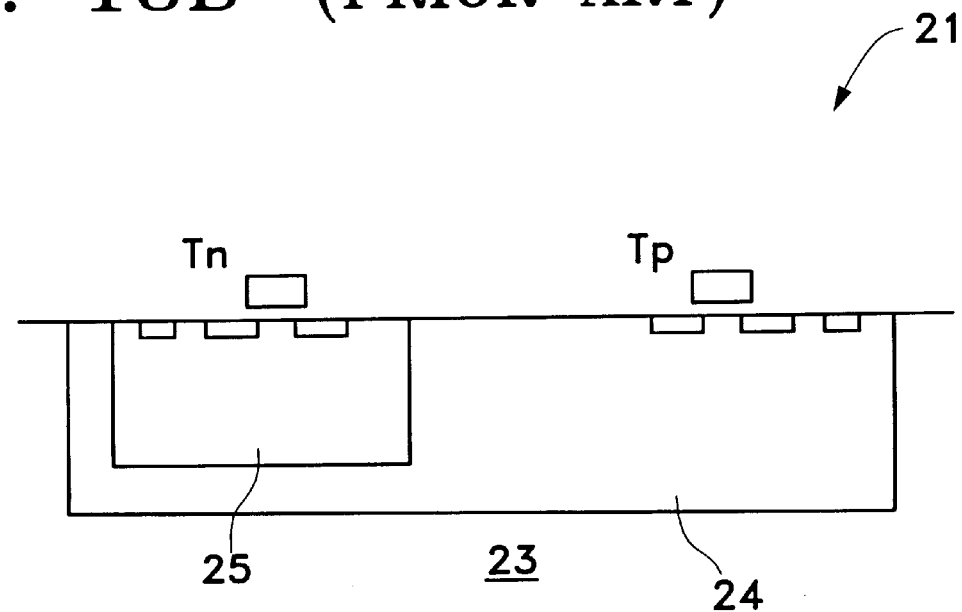
FIG. 18B is a cross-sectional view illustrating an exemplary structure of a CMOS invertor included in the row decoder shown in FIG. 18A.
Figure 19:
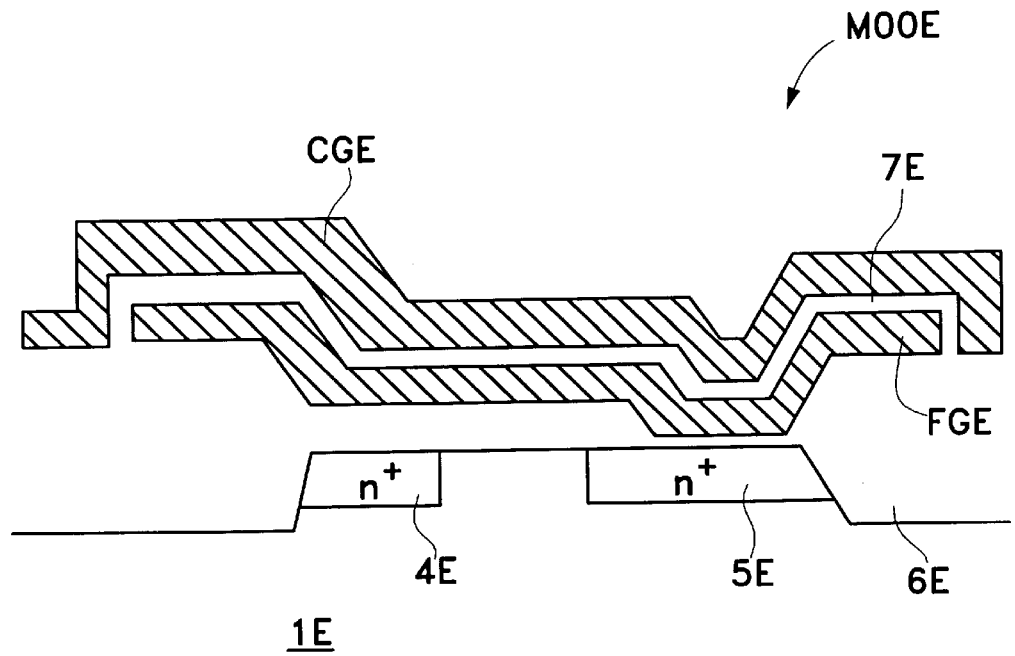
FIG. 19 is a cross-sectional view illustrating a cell structure of a conventional FLTOX type flash memory.
Figure 20:
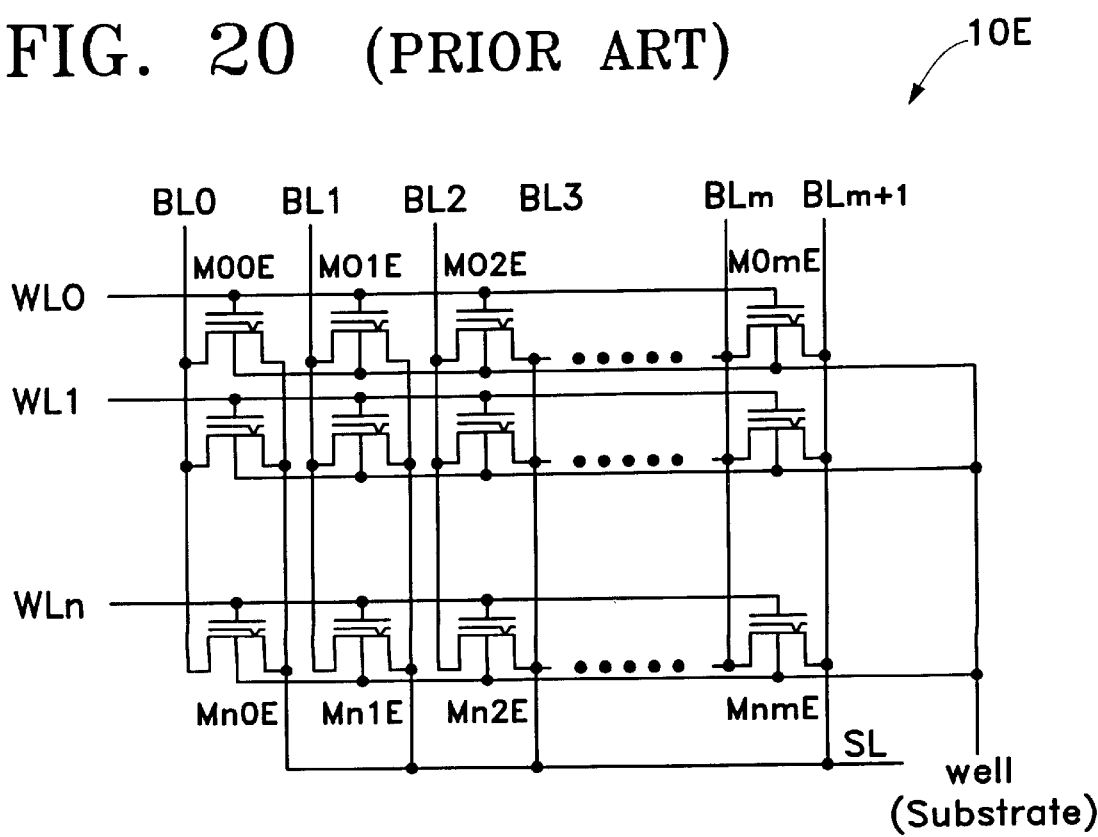
FIG. 20 is a circuit diagram illustrating a memory cell array to which a conventional flash memory of the cell structure shown in FIG. 19 is applied.

FIG. 18A is a circuit diagram illustrating a conventional row decoder 111 including a NAND gate 20 and a COMS invertor 21. FIG. 18B is a cross-sectional view illustrating an exemplary structure of a CMOS invertor 21 included in the row decoder 111.

To a terminal V1 coupled to the CMOS invertor 21, Vpp, Vcc, or Vss is applied. To a terminal V2 coupled to the CMOS invertor 21, Vas or Vneg is applied. When selected in accordance with a row selection signal, a p-channel transistor Tp is turned on so that the voltage at the terminal V1 is output. When not selected, an n-channel transistor Tn is turned on so that the voltage at the terminal V2 is output.

As shown in FIG. 18B, the CMOS invertor 21 has a double well structure such that a p well region 25 is formed in an n well region 24 which in turn is formed in a surface layer of a p substrate 23, an n-channel MOS transistor Tn being formed within the p well region 25. This configuration is adopted in order to prevent a forward bias from occurring between the substrate 23 and the diffusion layer when a negative voltage is applied to a terminal of the CMOS invertor 21, which would otherwise allow an unwanted current to flow so that a predetermined voltage cannot be output.

In the case a negative voltage is to be applied to the drain, it is necessary to employ a transistor having a double well structure also for the column decoder.

Figure 11:
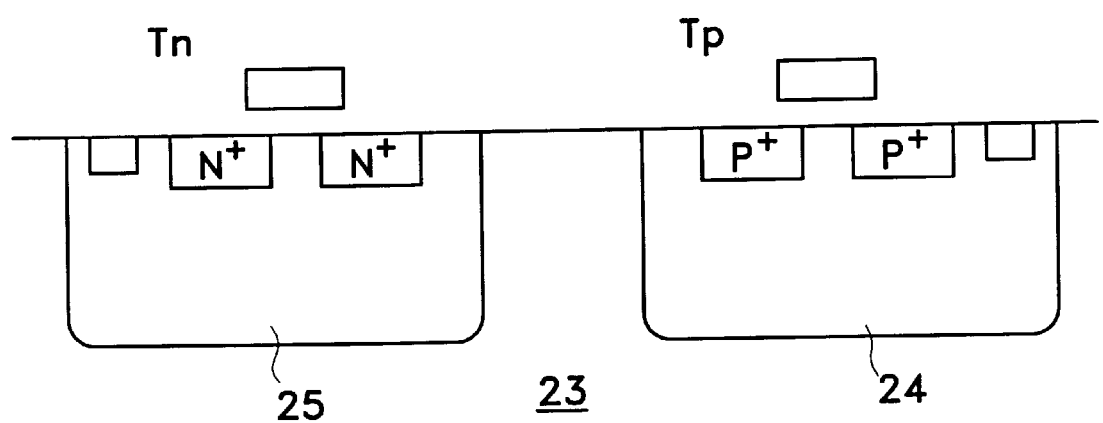
FIG. 11 is a cross-sectional view showing the structure of a transistor for use in the present invention.
Figure 13A:
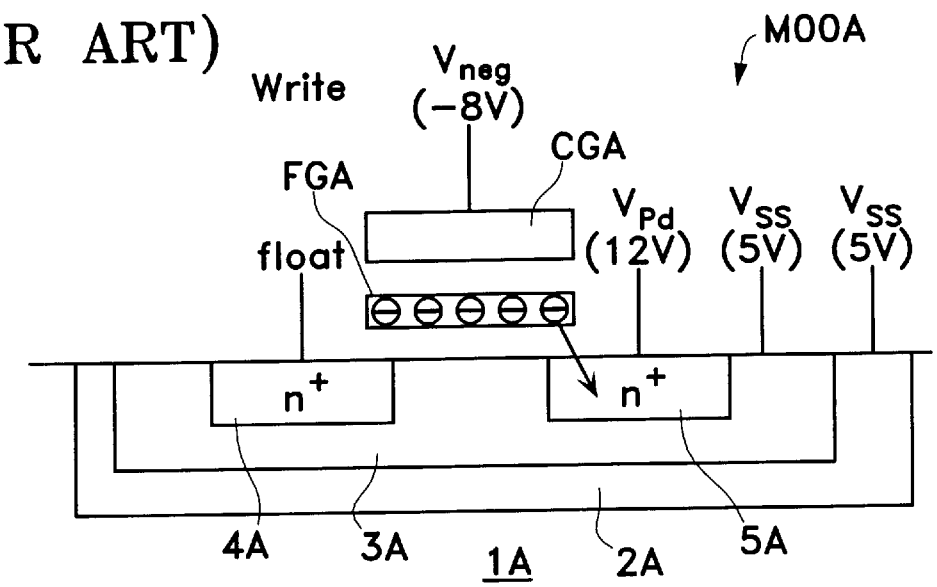
FIG. 13A is a cross-sectional view describing a write operation for a memory cell in a conventional DINOR type flash memory.
Figure 13B:
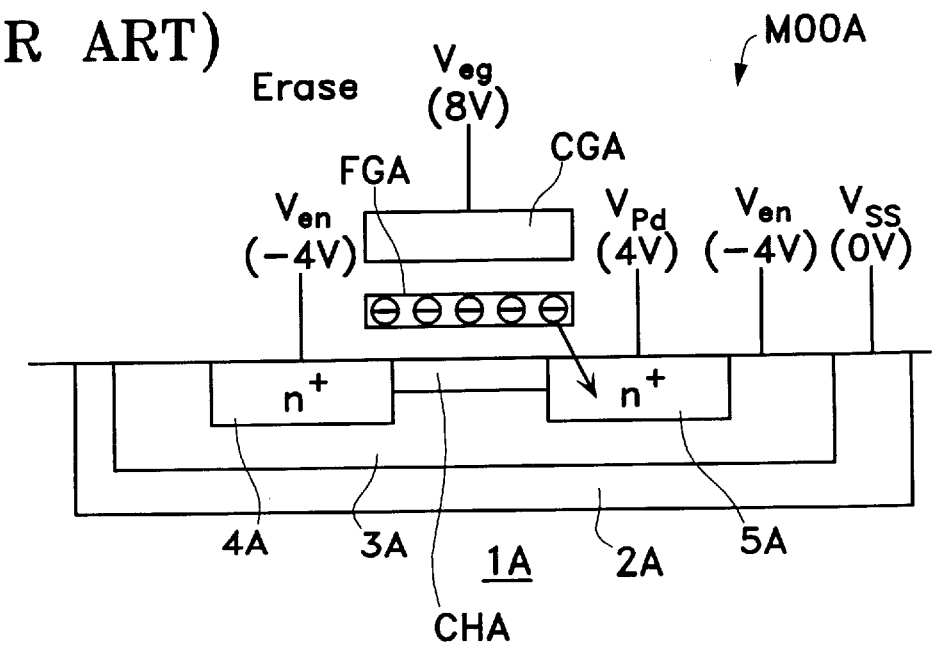
FIG. 13B is a cross-sectional view describing an erase operation for a memory cell in a conventional DINOR type flash memory.
Figure 13C:
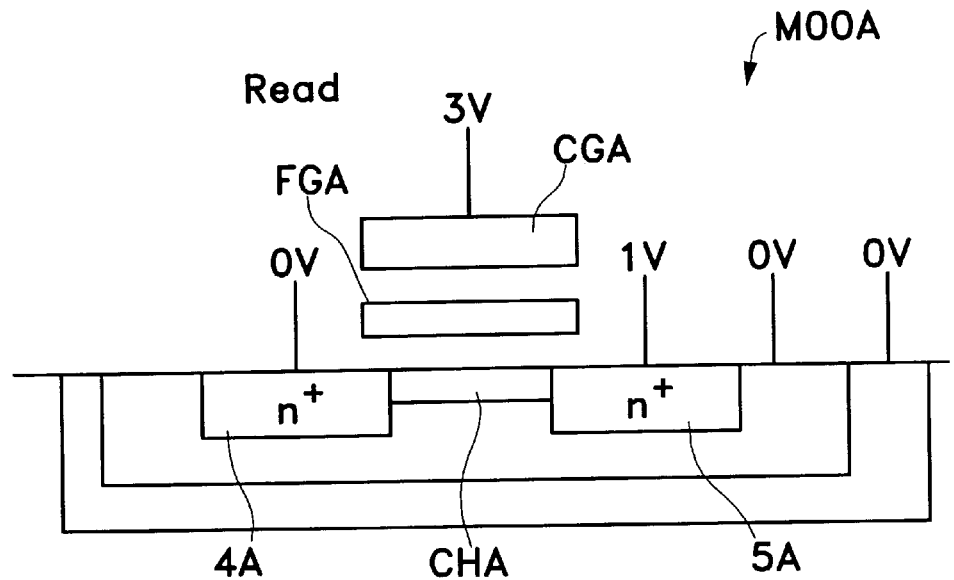
FIG. 13C is a cross-sectional view describing a read operation for a memory cell in a conventional DINOR type flash memory.
Figure 13D:
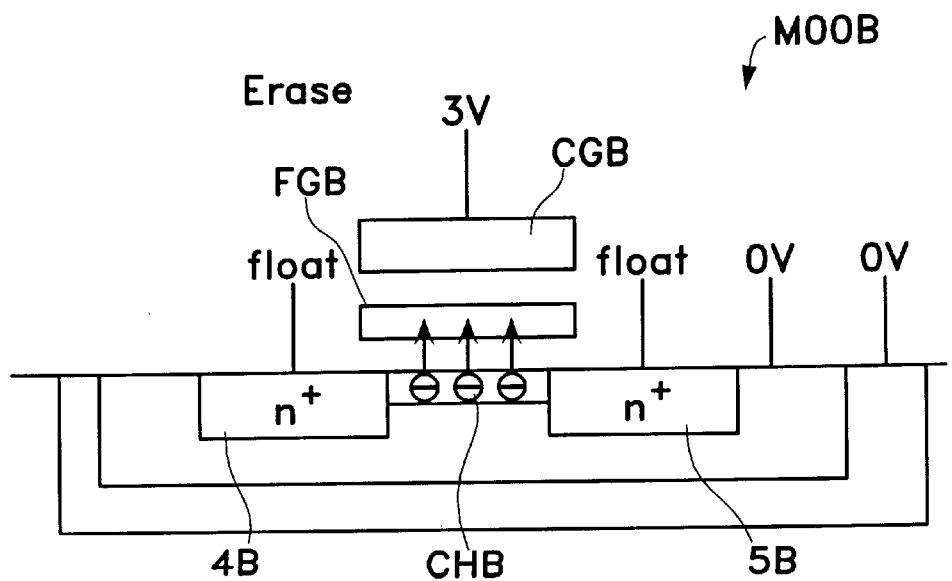
FIG. 13D is a cross-sectional view describing an erase operation for a memory cell in a conventional AND type flash memory.
Figure 14:
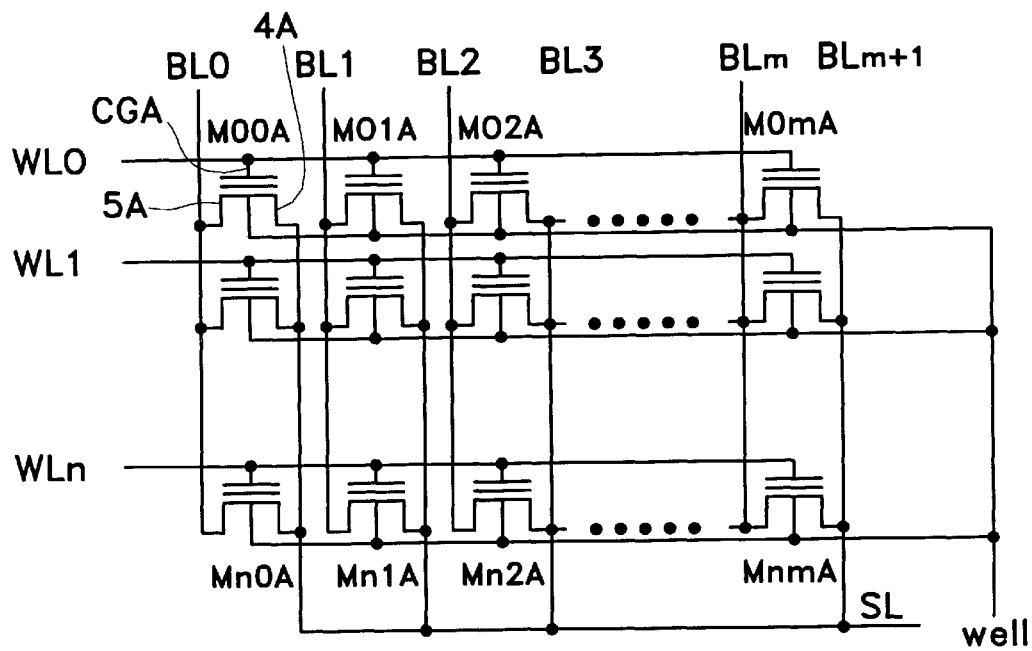
FIG. 14 is a circuit diagram illustrating the structure of a memory cell array of a conventional DINOR type flash memory.
Figure 15:
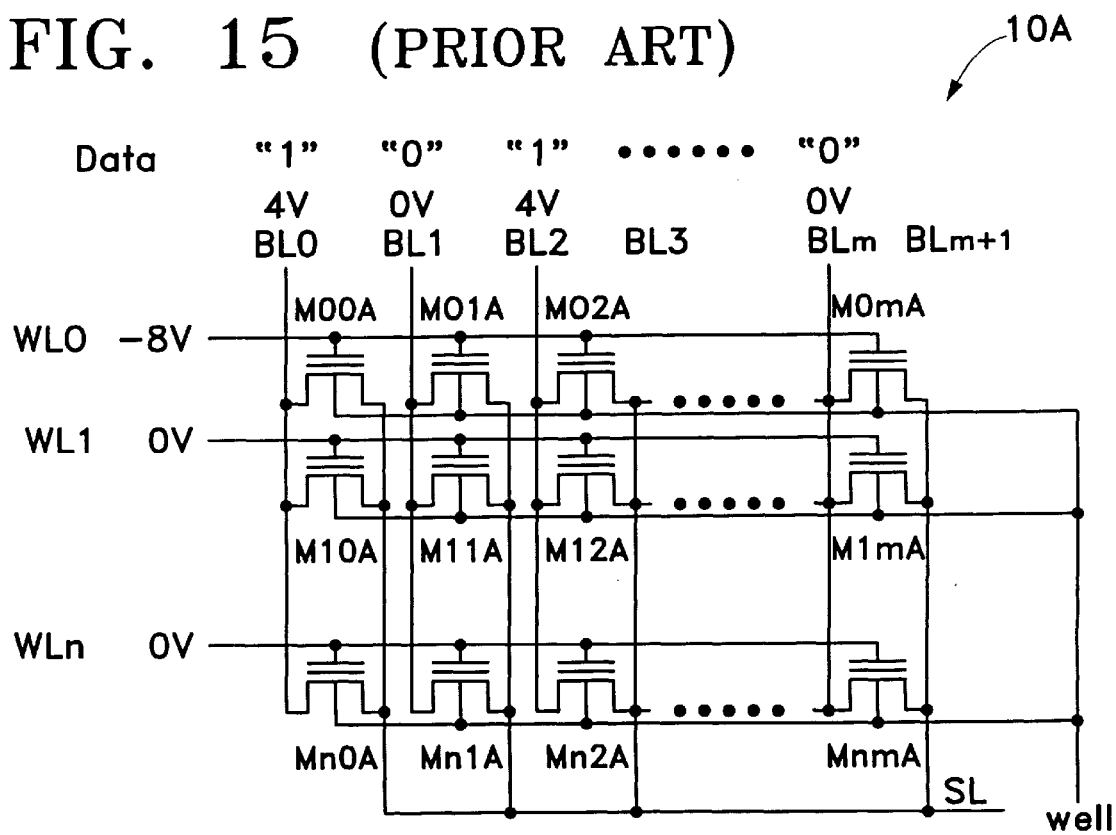
FIG. 15 is a circuit diagram showing the circuitry of a flash memory array of a conventional DINOR type flash memory and respective write voltages applied thereto.
Figure 16A:
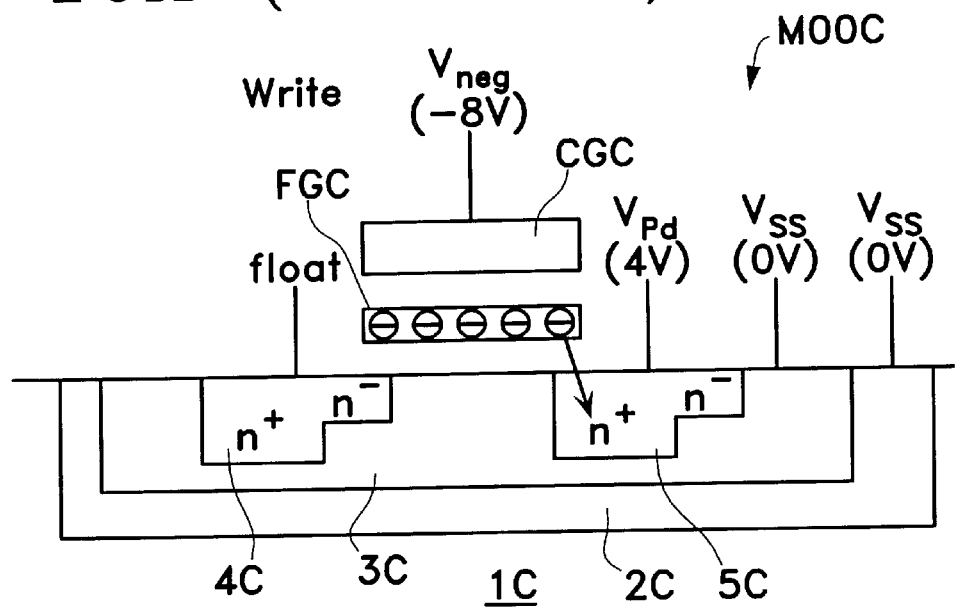
FIG. 16A is a cross-sectional view describing a write operation for a memory cell in a conventional ACT type flash memory.
Figure 16B:
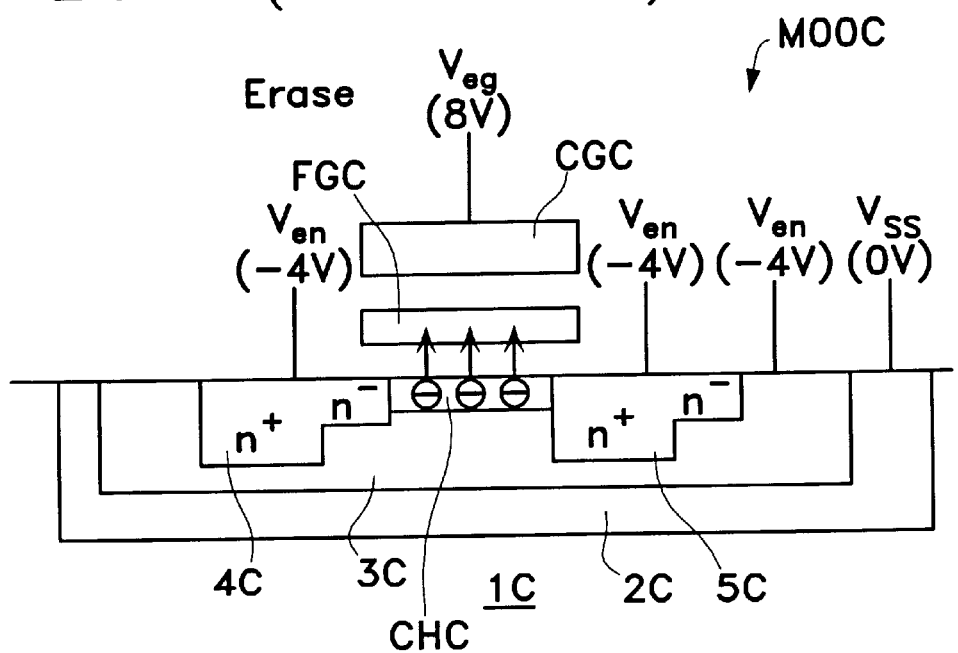
FIG. 16B is a cross-sectional view describing an erase operation for a memory cell in a conventional ACT type flash memory.
Figure 17:
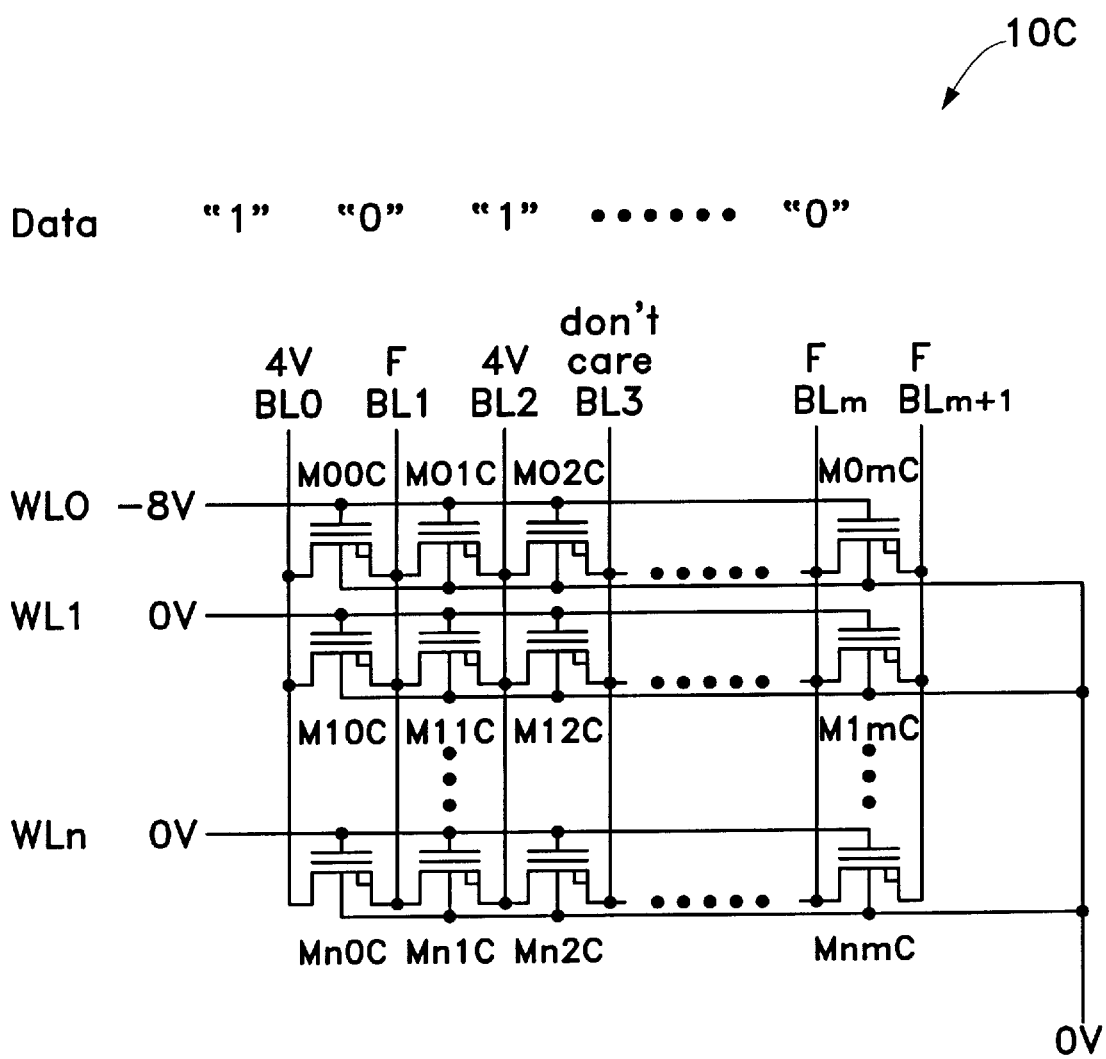
FIG. 17 is a circuit diagram showing the circuitry of a flash memory array of a conventional ACT type flash memory and respective write voltages applied thereto.

In contrast, according to the present invention, a negative voltage is not employed for either a write operation or an erase operation, so that a forward bias state does not occur between the substrate 23 and the diffusion layer, and no unwanted current will flow to prevent a predetermined voltage from being output. Therefore, as illustrated in FIG. 11, there is no need to employ a transistor having a double well structure. As a result, the chip areas of the peripheral circuitry, especially that required for the row and column decoders can be reduced.

In accordance with the non-volatile semiconductor memory device of the present invention, write and erase operations for a flash memory which functions based on the FN—FN operation can be performed by applying positive voltages and without applying negative voltages. As a result, the voltage system of the flash memory does not require a negative voltage pump, which is a requirement in the prior art for writing data. As a result, the chip area can be greatly reduced.

Also according to the present invention, it is unnecessary to apply a negative voltage to a column decoder and a row decoder, so that the decoder circuitry can be simplified.

Since the constraints concerning the withstand voltage on the drain side can be relaxed, the drain region can be relatively small, thereby further reducing the chip area.

By adopting a configuration incorporating virtual grounding type memory cells, the chip area can be further reduced.

By applying the first voltage to the word lines of unselected memory cells during data writing, it becomes possible to omit a regulator circuit, thereby further reducing the chip area.

Since a negative voltage is not utilized for a write or erase operation according to the present invention, it is unnecessary to employ transistors having a double well structure. As a result, it is possible to reduce the chip area of peripheral circuitry, in particular that required for the row decoder section and the column decoder section.

Since the floating gate can be made flat, its size can be reduced as compared to that in an FLTOX type flash memory, As a result, the chip area can be further reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A non-volatile semiconductor memory device comprising:
   a matrix of word lines and bit lines intersecting one another; and
   a memory cell of a stack gate type being disposed so as to correspond to each intersection of the matrix of the bit lines and the word lines, the memory cell including a control gate, a drain, and a source, the control gate being coupled to a corresponding one of the word line, the drain being coupled to a corresponding one of the bit lines, and the memory cell being capable of performing a write operation end an erase operation based on an FN tunnel phenomenon,
   wherein data is written to the memory cell by applying a reference voltage to the control gate, a first voltage to a well in which the memory cell is formed, and a second voltage to the drain,
   data is erased from the memory cell by applying a third voltage to the control gate and the reference voltage to the well,
   each of the first, second, and third voltages being equal to or greater than zero volts, and
   the second voltage being greater than the first voltage.

2. A non-volatile semiconductor memory device according to claim 1, wherein the source is coupled to a common source.

3. A non-volatile semiconductor memory device according to claim 1, wherein the source is coupled to one of the bit lines associated with a memory cell adjoining the memory cell.

4. A non-volatile semiconductor memory device according to claim 1 further comprising a power supply section for supplying a voltage to the control gate, the well, and the drain,
   wherein, when writing data to the memory cell, the power supply section applies the reference voltage to the control gate, the first voltage to the well, and the second voltage to the drain; and
   wherein, when erasing data form the memory cell, the power supply section applies the third voltage to the control gate and the reference voltage to the well.

5. A non-volatile semiconductor memory device according to claim 4,
   wherein the power supply section receives the second voltage and the reference voltage from a single external voltage source; and
   the power supply section includes a regulator circuit for regulating the second voltage to the first voltage and the third voltage.

6. A non-volatile semiconductor memory device according to claim 4, wherein the power supply section receives the first voltage, the second voltage, the third voltage, and the reference voltage from external voltage sources.

7. A non-volatile semiconductor memory device according to claim 1, wherein the second voltage and the third voltage are equal.

8. A non-volatile semiconductor memory device according to claim 1, wherein, when writing data to the memory cell, the first voltage is applied to at least one of the word lines associated with an unselected memory cell.

9. A non-volatile semiconductor memory device according to claim 1, wherein the well is formed of a p-type semiconductor layer, the well being surrounded by an n-type semiconductor layer so as to be electrically isolated from a substrate; and
   the first voltage is supplied to the n-type semiconductor layer when writing data to the memory cell.

10. A non-volatile semiconductor memory device according to claim 1, wherein each memory cell includes a floating gate formed between the control gate and the drain/source,
    an interlayer insulation film being formed between the floating gate and the control gate, and
    the floating gate having a flat shape.

* * * * *